United States Patent
Lin

(10) Patent No.: US 10,491,365 B1
(45) Date of Patent: Nov. 26, 2019

(54) CLOCK-DATA RECOVERY CIRCUIT WITH METASTABILITY DETECTION AND RESOLUTION

(71) Applicant: Xilinx, Inc., San Jose, CA (US)

(72) Inventor: Winson Lin, San Francisco, CA (US)

(73) Assignee: XILINX, INC., San Jose, CA (US)

(*) Notice: Subject to any disclaimer, the term of this patent is extended or adjusted under 35 U.S.C. 154(b) by 0 days.

(21) Appl. No.: 16/169,719

(22) Filed: Oct. 24, 2018

(51) Int. Cl.
*H04L 7/00* (2006.01)
*H04L 12/26* (2006.01)
*H04L 25/03* (2006.01)

(52) U.S. Cl.
CPC .......... *H04L 7/0025* (2013.01); *H04L 7/0012* (2013.01); *H04L 7/0033* (2013.01); *H04L 7/0083* (2013.01); *H04L 25/03* (2013.01); *H04L 43/028* (2013.01); *H04L 43/16* (2013.01)

(58) Field of Classification Search
CPC ... H04L 7/0025; H04L 7/0012; H04L 7/0033; H04L 7/0083; H04L 25/03; H04L 43/028; H04L 43/16
See application file for complete search history.

(56) References Cited

U.S. PATENT DOCUMENTS

| | | | |
|---|---|---|---|
| 9,209,960 B1 | 12/2015 | Leung et al. | |
| 9,882,703 B1 | 1/2018 | Xu et al. | |
| 9,960,902 B1 | 5/2018 | Lin et al. | |
| 2013/0243107 A1* | 9/2013 | Chmelar | H04L 25/03057 375/259 |

\* cited by examiner

*Primary Examiner* — Daniel C Puentes
(74) *Attorney, Agent, or Firm* — W. Eric Webostad

(57) ABSTRACT

Apparatus(es) and method(s) for CDR are described. In a CDR circuit, there is a bang-bang phase detector ("BBPD"), a baud-rate phase detector ("BRPD"), a multiplexer, and a control circuit. The BBPD, configured to receive data and crossing samples, generates a first result indicating a first phase difference between data and crossing samples. The BRPD, configured to receive data and peak samples, generates a second result indicating a second phase difference between data and peak samples. The multiplexer is configured to select either such result as a phase-detect output for a mode of operation. A control circuit is configured to clear a metastable state: for receipt of the first detect result, check for dithering, determine a direction for phase adjustment responsive to detection of the dithering, and provide a phase adjustment in the direction; and for receipt of the second detect result, operate to use the second phase difference generated.

20 Claims, 8 Drawing Sheets

CLOCK-DATA RECOVERY CIRCUIT WITH METASTABILITY DETECTION AND RESOLUTION

TECHNICAL FIELD

The following description relates to integrated circuit devices ("ICs"). More particularly, the following description relates to a clock-data recovery circuit of a receiver with metastability detection and resolution for an IC.

BACKGROUND

Conventionally, a clock-data recovery ("CDR") circuit, such as of a multi-gigabit serial data transceiver for example, may align a data clock to a median position with respect to corresponding edges of a waveform data eye, generally after equalization. Transmitted information may include data represented by symbols. Symbols may be sampled after this median position is aligned to a data clock, such as at one-half of a bit period for example. Such sampling position or sampling phase, namely at an interpolated phase sampling point, may be less than desirable due to an asymmetric data eye and/or a sampling phase position that is not one-half of a period T (i.e., 180 degrees) of a data eye away from a corresponding data crossing ("dXd"). A data eye may be asymmetric for any of several reasons, including without limitation precursor inter-symbol interference ("ISP").

However, for purposes of clarity by way of example without loss of generality, a CDR makes use of data eye and crossing information to determine a sampling phase in a middle region or median of a data eye and a corresponding edge to use for purposes of locking. A sampling phase to lock to the middle region of a data eye for a symbol may use a data slicer clock, and a corresponding crossing slicer clock is generally used for an associated edge of such a data eye. A CDR circuit is generally locked to such a median-based sampling phase.

For some CDR circuits, including bang-bang CDR circuits, a metastable state may arise. Because of this metastable state, it may take such CDR circuits more time to lock. However, for burst modes, and other high-speed serial signaling modes, such additional time to lock may negatively impact performance.

SUMMARY

An apparatus relates generally to clock data recovery ("CDR"). In a CDR circuit, a bang-bang phase detector is configured to receive data samples and crossing samples to generate a bang-bang detect result indicating a first phase difference between the data samples and the crossing samples. A baud-rate phase detector is configured to receive the data samples and peak samples to generate a baud-rate detect result for indicating a second phase difference between the data samples and the peak samples. A multiplexer is configured to select either the bang-bang detect result or the baud-rate detect result as a selected phase-detect output responsive to a mode of operation. A control circuit is configured to clear a metastable state by: in response to receiving the bang-bang detect result, check for dithering, determine a direction for phase adjustment responsive to detection of the dithering, and provide a phase adjustment in the direction; and in response to receiving the baud-rate detect result, use the second phase difference generated.

Another apparatus relates generally to CDR. In another CDR circuit, a bang-bang phase detector is configured to receive data samples and crossing samples to generate a bang-bang detect result indicating a phase difference between the data samples and the crossing samples. A control circuit includes a metastable detector, a mode select circuit, and a phase adjust circuit. The metastable detector is configured to receive the bang-bang detect result. The control circuit is configured to activate the metastable detector and the phase adjust circuit responsive to receipt of an asserted one of a start of burst signal or an end of burst signal for a corresponding selected mode of operation in order to enter a metastable detection-kick mode. The control circuit in the metastable detection-kick mode is configured to check for dithering, determine a direction for a phase adjustment responsive to detection of the dithering, and provide a phase adjustment in the direction.

A method relates generally to CDR. In such a method, a received signal is obtained by the clock data recovery circuit for generating a sampling clock signal. The generating includes: sampling of a received signal to generate data samples and peak samples responsive to a data clock signal having a data phase; sampling of the received signal to generate crossing samples responsive to a crossing clock signal having a crossing phase; generating a bang-bang detect result from the data samples and the crossing samples by a bang-bang phase detector indicating a first phase difference between the data samples and the crossing samples; generating a baud-rate detect result from the data samples and the peak samples by a baud-rate phase detector indicating a second phase difference between the data samples and the peak samples; generating by a control circuit a select signal for a selected mode of operation from a plurality of operational modes; selecting either the bang-bang detect result or the baud-rate detect result as a selected phase-detect output from a multiplexer responsive to the select signal; and operating the control circuit in the selected mode of operation to clear a metastable state.

Other features will be recognized from consideration of the Detailed Description and Claims, which follow.

BRIEF DESCRIPTION OF THE DRAWINGS

Accompanying drawings show exemplary apparatus(es) and/or method(s). However, the accompanying drawings should not be taken to limit the scope of the claims, but are for explanation and understanding only.

FIGS. 6-1 through 6-4 are respective flow diagrams depicting corresponding examples of flows for Operational Modes 1 through 4, respectively.

DETAILED DESCRIPTION

Figure 1:
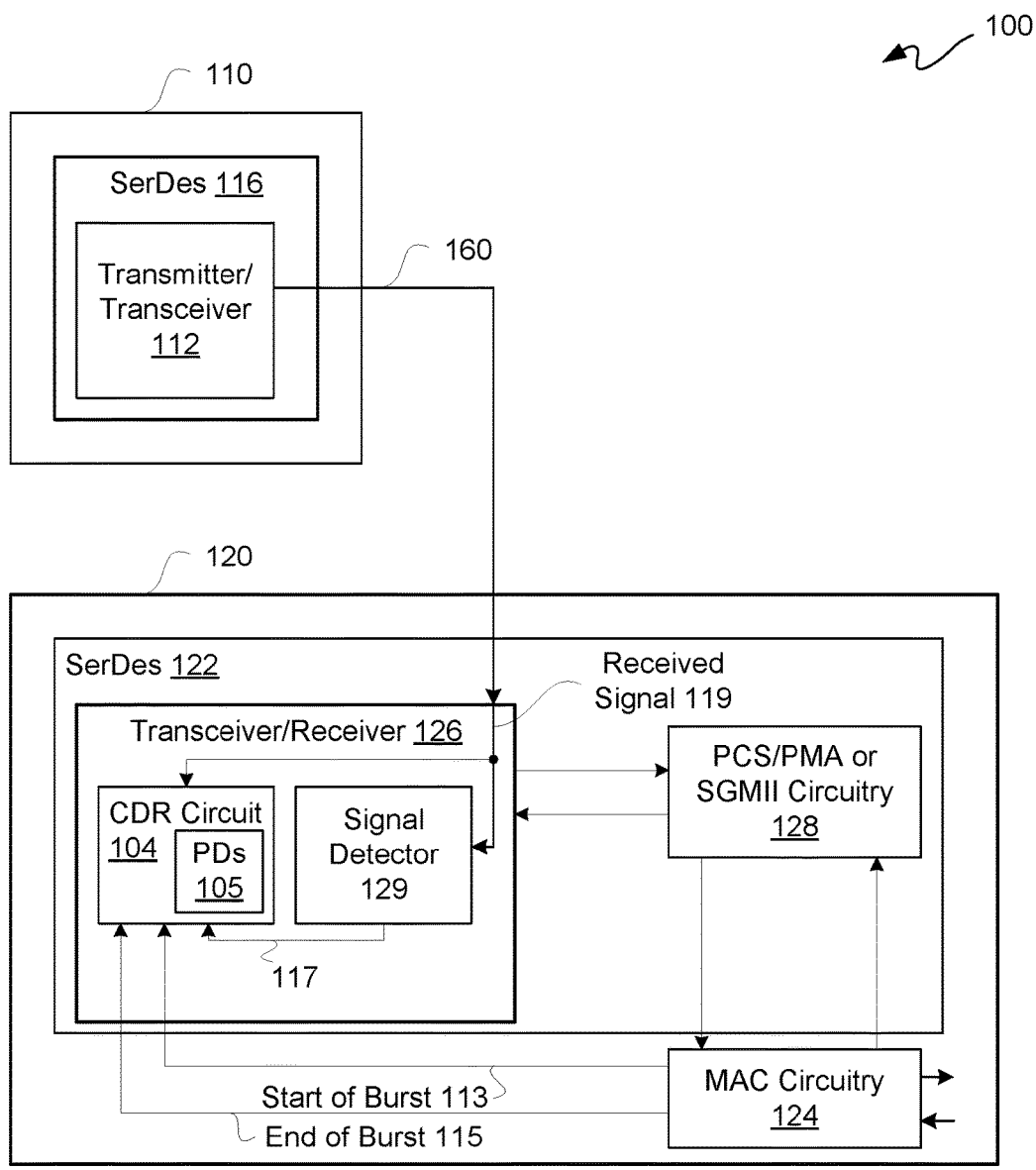
FIG. 1 is a block diagram depicting an example of a communication system.

In the following description, numerous specific details are set forth to provide a more thorough description of the specific examples described herein. It should be apparent, however, to one skilled in the art, that one or more other examples and/or variations of these examples may be practiced without all the specific details given below. In other instances, well known features have not been described in detail so as not to obscure the description of the examples herein. For ease of illustration, the same number labels are used in different diagrams to refer to the same items; however, in alternative examples the items may be different.

Exemplary apparatus(es) and/or method(s) are described herein. It should be understood that the word "exemplary" is used herein to mean "serving as an example, instance, or illustration." Any example or feature described herein as "exemplary" is not necessarily to be construed as preferred or advantageous over other examples or features.

Before describing the examples illustratively depicted in the several figures, a general introduction is provided to further understanding.

Generally, to move a data clock and/or a crossing clock, a CDR circuit uses information from an instant ("current") median position of a symbol/data eye ("current data position"), an associated instant ("current") position of a data crossing position for such symbol/data eye ("current crossing position"), and an immediately next median position of a next symbol/data eye ("next data position") with respect to such current data position. Based on for example sampled data ("samples"), such as from a data slicer for sampling current data position and a crossing slicer for sampling current crossing position of a sampler circuit, a downstream CDR circuit is configured to determine if an instant sampling phase is early or late with respect to a median-based sampling phase. Such a CDR circuit is configured to adjust sampling phase accordingly to move a data clock and a crossing clock to lock to such a median-based sampling phase.

A bang-bang CDR circuit uses both data and crossing samples, conventionally sampled 90 degrees out-of-phase with respect to one another. Data and crossing (or edge) samples may be obtained by oversampling for subsequent input to a bang-bang CDR.

A bang-bang CDR uses such data and crossing samples to determine if a current data sampling phase or position should be adjusted, in which direction such adjustment should be made, and where to stop such adjustment. Eventually, a bang-bang CDR circuit may reach equilibrium, namely when a data sampling phase dithers left and right, or slightly early and slightly late, around a "best" data sampling position or a "best" crossing sampling position. Dithering generally means that there is about a 50-50 percent chance of obtaining a logic 1 or a logic 0 when sampling in the middle region or median of a zero crossing transition for example. A bang-bang CDR may enter a locked state or condition after such dithering. If such bang-bang CDR dithering about the middle of a zero crossing transition happens to shift away from such middle region, negative feedback from early or late information, depending on direction of such shift, brings such sampling back towards the middle region of such transition.

However, for a bang-bang CDR circuit in a metastable state, effectively crossing and data sampling clocks are 90 degrees misaligned, so for example data clock sampling dithers about the middle of a zero crossing transition and crossing clock sampling dithers about the middle of a data eye. In a metastable state, this dithering also has about a 50-50 percent chance of obtaining a logic 1 or a logic 0 when sampling in the middle region or median of a zero crossing transition for example. For random data or uncorrelated data being sampled, current data and next data in a stream may cause a bang-bang CDR circuit to be stuck in such sampling positions, akin to a locked condition, as a net sum of decisions to move left and right is zero. In other words, such a metastable condition prevents a bang-bang CDR circuit from moving toward correct sampling positions, absent a "nudge" or "kick" to a phase interpolator ("PI") code to move or otherwise resolve such sampling positions. While a bang-bang CDR circuit may eventually become unstuck after some time due to some random data effectively kicking such bang-bang CDR circuit out of a metastable condition, such time delay may introduce too much latency in achieving a lock condition to meet a specified latency.

In response to a "kick", a bang-bang CDR circuit is pushed out of a metastable state, including pulling a crossing clock towards an edge or zero crossing of a sampled symbol, and hence pulling a data clock towards the middle region of a corresponding data eye. Generally, around 16 codes which corresponds to a quarter UI period is a sufficient amount for a kick. A kick is a sufficient number of codes to provide enough of a jump to guarantee that bang-bang CDR circuit is not stuck in a metastable state that could span multiple codes wide. In the past, detection of a metastable condition was performed in software by observing a PI code, and a "kick," which is used to reduce lock time when stuck in a metastable state, was triggered through an external port to a chip having such a bang-bang CDR. However, this off-chip activity of observing and triggering adds to latency in obtaining a locked state, namely getting out of a metastable condition and then locking, of a bang-bang CDR.

To reduce time getting from a metastable condition to a locked condition, an on-chip system for metastable condition detection and on-chip kick or nudge to a PI code to resolve a possible or actual metastable condition detected is described below. However, before such on-chip circuitry is described, additional background regarding detection of metastability may be useful.

A metastable condition of a bang-bang CDR circuit may be detected by observing a bang-bang phase detector output. When samples, crossing or data, provided as input to a bang-bang phase detector are too early, a bang-bang phase detector output magnitude would be all positive indications indicating a move or shift to the right or "later" in a PI code, such as a unit interval ("UI"), is to be performed. When samples, crossing or data, provided as input to a bang-bang phase detector are too late, a bang-bang phase detector output magnitude would be all negative indications indicating a move or shift to the left or "earlier" in PI code is to be performed. Clearly, for these magnitude outputs, no metastable condition would be detected.

When samples, crossing or data, provided as input to a bang-bang phase detector are in respective "best" sampling positions as in a locked condition, a bang-bang phase detector output magnitude generally toggles between positive and negative values due to random data, and so no move or shift in sampling position is called for. However, when samples, crossing or data, provided as input to a bang-bang phase detector are in respective "worst" sampling positions as in a metastable condition, a bang-bang phase detector output magnitude generally toggles between positive and negative values due to random data, and so no move or shift in sampling position is called for. In other words, from bang-bang phase detector output magnitude there is no apparent difference between a locked and a metastable condition.

To address this absence of difference and to keep circuit spatial locality of metastable detecting and PI code kick incrementing on-chip, and more particularly within a CDR circuit, to reduce latency to lock, nudging or kicking of a PI code is performed for both locked and metastable conditions. In other words, instantaneous phase detector output may be used to determine whether a locked or metastable condition exists, though not to determine which of such two conditions is currently present. In response to such instantaneous phase detector output indicating presence of a locked or metastable condition, a recovered clock is moved out of a current sampling phase, such as by a PI code kick adjustment for example, to resolve the possibility of a metastable condition. For a locked condition, such a PI code kick adjustment has a slight, nearly immeasurable, impact on lock time latency, as a bang-bang phase detector quickly adjusts a bang-bang CDR circuit back to a locked condition. However, for a metastable condition, such an immediate PI code kick adjustment has a significant reduction on lock time latency, as a bang-bang phase detector quickly moves to a bang-bang CDR circuit to correct sampling positions to obtain a lock.

Once locked, a bang-bang CDR circuit should not have a metastable condition again for a current burst. However, a metastable condition can appear or reappear when a new burst of data comes in, as a new-current burst of data phase is not correlated to the phase of previous burst of data.

With the above general understanding borne in mind, various configurations for a receiver having a CDR circuit are generally described below.

FIG. 1 is a block diagram depicting an example of a communication system 100. Communication system 100 includes a transmitter or transmitter of a transceiver ("transmitter") 112 coupled to a receiver or a receiver of a transceiver ("receiver") 126 over a transmission medium 160. Transmitter 112 can be part of a serializer-deserializer ("SerDes") 116. Receiver 126 can be part of a SerDes 122. A receiver of SerDes 116 and a transmitter of SerDes 122 are omitted for purposes of clarity and not limitation. Even though single signal lines are illustratively depicted for purposes of clarity, such signal lines may represent a single or multiple signals or single or multiple signal paths.

Receivers are used in wired or wireless data communications. In some networks, whether for mobile phone, Internet, Voice-Over-Internet-Protocol ("VOIP"), data centers, and other networks, a clock signal is inferred from the data. In such applications, receivers use CDR to obtain a recovered clock from transmitted data, as well as recover such data transmitted. This transmitted data may be sent in bursts of packets, where each packet includes a preamble followed by data payload for example. Packets may be driven from transmitters on networks with different phases relative to one another. Receivers with CDR may be configured to track each new burst of data, and this tracking may have a time limit limited by length of a preamble. Hence, a fast locking CDR circuit for a burst mode is useful. In the following description, wired data communications are generally described for a transmission medium 160; however, in other applications, a wireless transmission medium may be used.

Transmission medium 160 may include an electrical or optical path between transmitter 112 and receiver 126. Transmission medium 160 can include printed circuit board (PCB) traces, vias, cables, connectors, decoupling capacitors, and/or the like. In some examples, SerDes 116 can be located in an integrated circuit (IC) 110, and SerDes 122 can be located in an IC 120. In this example, a CDR circuit 104 and a signal detector 129 of receiver 126 are co-located on a same IC 120, PCS/PMA (Physical Coding Sublayer and Physical Medium Attachment) or SGMII (Serial Gigabit Media Independent Interface) circuitry 128 and MAC (Medium Access Control or Media Access Control) circuitry 124 may also be located in IC 120.

Transmitter 112 may drive serial data onto transmission medium 160, such as by using a digital baseband modulation technique for example. Such serial data may be received by receiver 126 as received signal 119, subject to noise and other interference.

In general, such serial data may be divided into symbols. Transmitter 112 may convert each symbol into an analog voltage mapped to such symbol. Transmitter 112 may couple an analog voltage generated from each symbol to transmission medium 160. In some examples, transmitter 112 may use a binary non-return-to-zero ("NRZ") modulation scheme. In binary NRZ, a symbol is one bit of serial data and two analog voltages are used to represent each bit. In other examples, transmitter 112 may use multi-level digital baseband modulation techniques, such as pulse amplitude modulation ("PAM"), where a symbol includes a plurality of bits of serial data and more than two analog voltages are used to represent each bit.

CDR circuit 104 and signal detector 129 may each be coupled for receipt of received signal 119. An example structure of receiver 126 is further described below with respect to FIG. 2. Receiver 126 receives an analog received signal 119 from transmission medium 160. CDR circuit 104 operates to recover data and a clock from such analog signal. Receiver 126 provides such recovered data to PCS/PMA or SGMII circuitry 128 for decoding and further processing. PCS/PMA or SGMII circuitry 128 may provide such decoded and otherwise processed recovered data to MAC circuitry 124 coupled to SerDes 122. This is just one of many possible configurations of a SerDes 122. In another example, a transceiver 126 may be part of PCS/PMA or SGMII circuitry 128. Furthermore, even though only one channel is described for purposes of clarity, more than one communication channel may be present.

Generally, the following description pertains to a receiver or front end of a receiver, as described below in additional detail. Accordingly, PCS/PMA or SGMII circuitry 128 and MAC circuitry 124, as well as some of the details regarding interfacing between receiver 126 and such other circuitry is not described in unnecessary detail for purposes of clarity and not limitation.

Signal detector 129 may receive an unequalized received signal 119. Along those lines, for a noisy channel associated with transmission medium 160, received signal 119 may be more problematic for signal detector 129 to resolve. It is possible that a signal channel is too noisy as for signal detector 129 to resolve a signal. A signal detector output signal 117 responsive to received signal 119 may be provided from signal detector 129 to CDR circuit 104, as described below in additional detail. Additionally, CDR circuit 104 may include phase detectors ("PDs") circuit 105 as described below in additional detail.

For a downstream decoded and otherwise processed received signal 119, MAC circuitry 124 may be configured to provide a start of burst signal 113 and/or an end of burst signal 115. Start of burst signal 113 and end of burst signal 115 may be used for a burst communications mode, such as for example where a group of packets are transmitted with short interpacket gaps. Start of burst signal 113 and end of burst signal 115 may be provided from MAC circuitry 124 to CDR circuit 104, as described below in additional detail.

Figure 2:
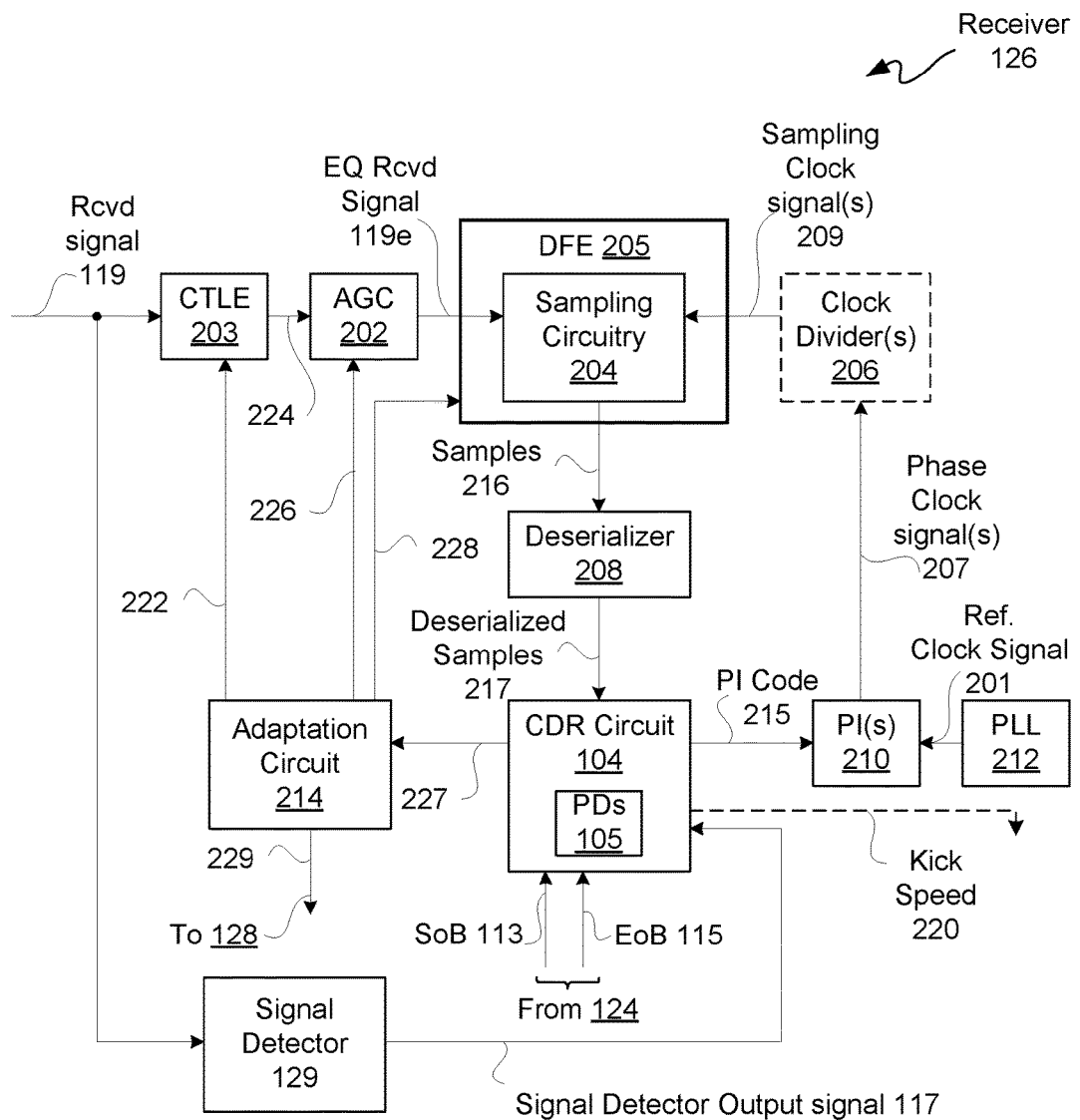
FIG. 2 is a block diagram depicting an example of a receiver.

FIG. 2 is a block diagram depicting an example of a receiver 126. With simultaneous reference to FIGS. 1 and 2, this example of receiver 126 is further described.

In this example, receiver 126 includes a signal detector 129, a continuous time linear equalizer ("CTLE") 203, an automatic gain control ("AGC") circuit 202, sampling circuitry 204, an optional clock divider 206, a deserializer 208, a CDR circuit 104, a phase interpolator ("PI") 210, a phase-locked loop ("PLL") circuit 212, and an adaptation circuit 214. An output of CTLE 203 is coupled to an input of AGC circuit 202. An output of AGC circuit 202 is coupled to inputs of sampling circuitry 204. Output of AGC circuit 202 may be an equalized gain-controlled version of received signal 119, namely equalized received signal 119e. Equalized received signal 119e may be sampled by sampling circuitry 204 for providing samples 216. An output of optional clock divider 206 may be coupled to an input of sampling circuitry 204 to provide a sampling clock signal 209 thereto for such sampling.

Outputs, such as samples 216, of sampling circuitry 204 are coupled to inputs of deserializer 208. Outputs, such as groups of parallelized or deserialized samples, of deserializer 208 are coupled to inputs of CDR circuit 104, and more particularly to inputs of phase detectors circuit 105. CDR circuit 104 may further be coupled to receive start of burst signal ("SoB") 113 and end of burst signal ("EoB") 115 from MAC circuit 124.

Signal detector 129 may be coupled to receive received signal 119 and configured to provide a signal detector output signal 117 responsive to such received signal 119. CDR circuit 104 may be coupled to receive signal detector output signal 117.

Outputs of CDR circuit 104 are coupled to an input of adaptation circuit 214 and an input of the PI 210, respectively. Such output from CDR circuit 104 to PI 210 may be to provide a PI code signal 215, which PI code signal 215 may be adjusted as described below in additional detail. Another input of PI 210 is coupled to an output of PLL circuit 212 to receive a reference clock signal 201.

In an example, an output of PI 210 is coupled to inputs of sampling circuitry 204. In another example, an output of PI 210 is coupled to an input of clock divider 206, and an output of clock divider 206 is coupled to an input of sampling circuitry 204. PI 210 may output a phase clock signal 207, namely a clock signal corresponding to reference clock signal 201 with a phase adjusted responsive to PI code signal 215. However, for oversampling, such frequency of such phase clock signal 207 in some examples may be increased such as by clock divider 206. Accordingly, a phase clock signal 207 directly from PI 210 may be used as a sampling clock input to sample circuitry 204, or a sampling clock signal 209 output from clock divider 206 may be used as a sampling clock input to sample circuitry 204.

Outputs 222, 226, and 229 of adaptation circuit 214 are coupled to CTLE 203, AGC circuit 202, and PCS/PMA or SGM II circuitry 128, respectively. In an example, sampling circuitry 204 can be part of a decision feedback equalizer ("DFE") 205. In such example, another output 228 of adaptation circuit 214 may be coupled to DFE 205.

In operation, CTLE 203 receives an analog signal from transmission medium 160. CTLE 203 operates as a high-pass filter to compensate for low-pass characteristics of transmission medium 160. The peak of a frequency response of CTLE 203 can be adjusted based on a CTLE adjust signal 222 provided by adaptation circuit 214. AGC circuit 202 receives an equalized analog signal 224 from CTLE 203. AGC circuit 202 adjusts the gain of such equalized signal 224 based on a gain adjust signal 226 provided by adaptation circuit 214. In another example, AGC circuit 202 can precede CTLE circuit 203.

Sampling circuitry 204 generates data, peak and crossing samples from equalized received signal 119e output from AGC circuit 202 based on a sampling phase clock signal 207 as supplied by PI 210, or clock signal 209 as provided by clock divider 206. Sampling circuitry 204 can generate data, crossing, and peak samples. In this example, a data sampling clock is used to generate data and peak samples, and crossing samples are generated using a crossing sampling clock. Such crossing sampling clock is shifted in phase from data sampling clock by 90 degrees for a generally symmetric data eye. For purposes of clarity by way of example and without loss of generality, it shall be assumed that a 90 degree offset in phase between data and crossing sampling clocks is used by sampling circuitry 204.

Sampling circuitry 204 can generate both data and crossing sampling clocks from sampling using phase clock signal 207 supplied by PI 210 or clock signal 209 supplied by clock divider 206 using a 90 degree phase shifter, as described below in additional detail. Optionally, PI 210 can supply both data and crossing sampling clocks. In this example, PI 210 is two PIs 210, where one PI 210 controls a 0 degree clock and another PI 210 controls a 90 degree clock. Each PI 210 receives a PI code signal 215 and a reference clock signal 201. PIs 210 respectively control such 0 and 90 degree clocks independently of one another. Along those lines, clock divider 206 may be two clock dividers 206, where each of such PIs 210 may have its own clock divider 206 for respectively receiving a separate phase clock signal 207. Thus, sampling clock signal 209 may be two clock sampling clock signals 209, namely a 0 and a 90 degree clock signal, separately generated from PIs 210. In other words, in this configuration two separate clock signals are used instead of using a single clock and then shifting this single clock signal to get a 90 degree clock signal too. In another example, clock divider 206 can generate both data and crossing sampling clocks from a phase clock signal 207 supplied by PI 210. Clock divider 206, if present, can increase or reduce frequency of phase clock signal 207 supplied by PI 210.

In this example, sampling circuitry 204 is part of DFE 205. DFE 205 may further equalize equalized received signal 119e of AGC circuit 202 to minimize inter-symbol interference ("ISI").

Each data, peak, and crossing sample includes one or more bits depending on the type of modulation scheme employed (e.g., one bit samples for binary NRZ and multi-bit samples for PAM-X). For PAM-4, there are two bits per symbol, and for PAM-8, there are three bits per symbol. Deserializer 208 groups data samples, peak samples, and crossing samples to generate corresponding deserialized signals. However, deserializer 208 effectively unifies three separate parallel data, peak, and crossing sample streams into a "wave front" of deserialized signals to be processed by CDR circuit 104.

Again, CDR circuit 104 generates a PI code signal 215 in part from deserialized samples ("deserialized signal") 217 generated by deserializer 208. PI 210 receives a reference clock signal 201 from PLL 212. PI 210 shifts phase of reference clock signal 201 based on PI code signal 215 output by CDR circuit 104. PI 210 outputs a phase-shifted reference clock signal as a phase clock signal 207, which may or may not be directly used as a sampling clock signal.

CDR circuit 104 outputs a data signal 227 to adaptation circuit 214. Data signal 227 includes deserialized data samples output by sampling circuitry 204 and deserialized by deserializer 208. Adaptation circuit 214 generates CTLE adjust signal 222 and gain adjust signal 226 respectively for CTLE 203 and AGC circuit 202 based on such deserialized data samples using known algorithms. If DFE 205 is present, adaptation circuit 214 generates a control signal 228 for adjusting the taps of DFE 205 using a known algorithm. Adaptation circuit 214 outputs a data output signal 229 to PCS/PMA or SGMII circuitry 128. PCS/PMA or SGMII circuitry 128 processes data output signal 229 to recover transmitted data.

Additionally, optionally, CDR circuit 104 may be configured to provide a frequency adjustment ("kick speed") signal 220 to provide data to a frequency control block (not shown). Kick speed signal 220 may be used to increase or decrease frequency of a reference clock signal 201 by PLL 212, where PLL 212 may receive data from such frequency control block for such adjustment.

Figure 3:
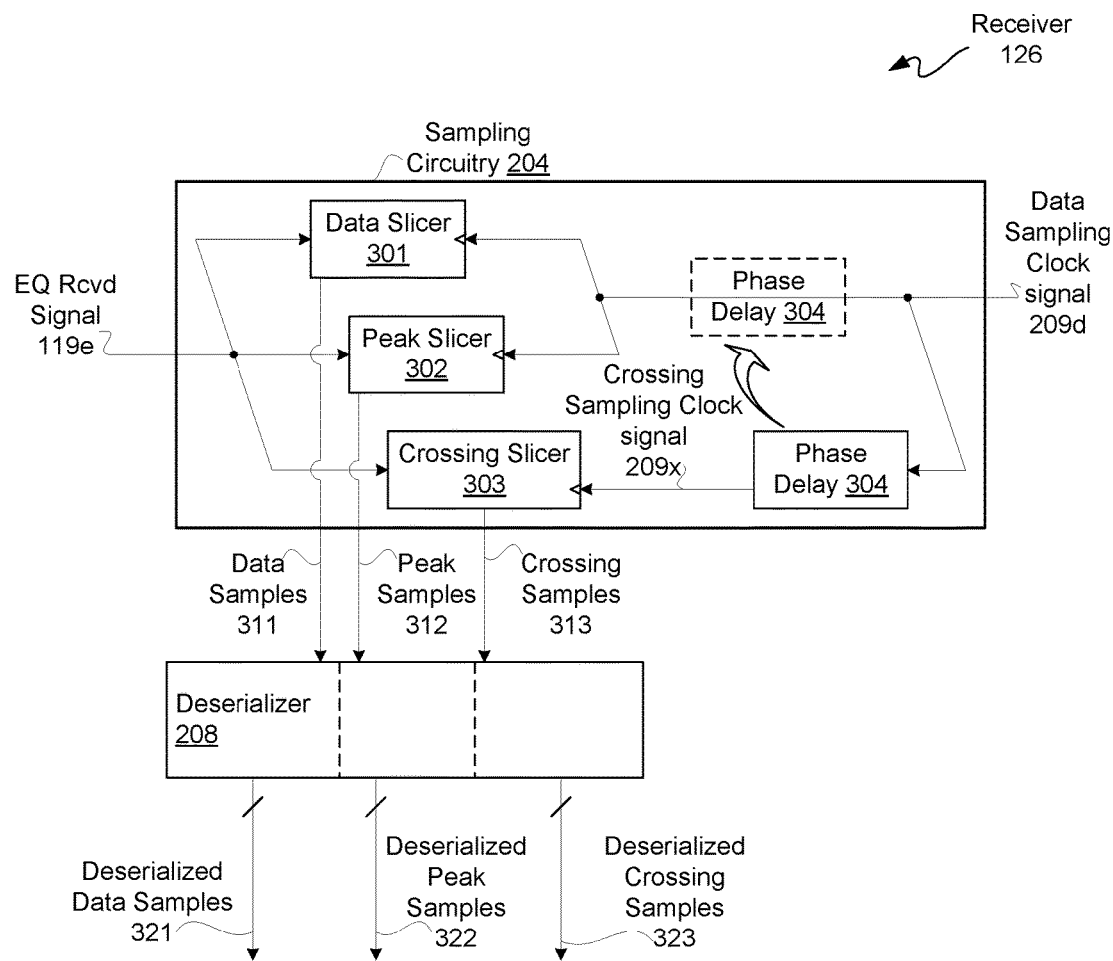
FIG. 3 is a block diagram depicting an example of a portion of an example of a receiver for sampling circuitry and a deserializer.

FIG. 3 is a block diagram depicting an example portion of an example of a receiver 126 for sampling circuitry 204 and deserializer 208. This portion of receiver 126 of FIG. 3 is further described with simultaneous reference to FIGS. 1 through 3.

Generally, sampling circuitry 204 may include various sampling circuits and other circuits, including without limitation a data slicer 301, a peak slicer 302, and a crossing slicer 303. An equalized received signal 119e may be a data input to each of slicers 301 through 303 to respectively obtain data samples 311, peak samples 312, and crossing samples 313. In this example, a data sampling clock signal 209d, such as previously described sourced from clock divider 206 or PI 210, having a data phase may be provided to a clock input of each of slicers 301 and 302 and to a clock input of phase delay 304 of sampling circuitry 204. In this example, phase delay 304 may be for a 90 degree phase shift with respect to data sampling clock signal 209d. Optionally, if two PIs 210 are used, then a data sampling clock signal 209d may be sourced from one of such two PIs 210 and an associated clock divider 206, if present, and a crossing sampling clock signal 209x may be sourced from another one of such two PIs 210 and an associated clock divider, if present. In this configuration, phase delay 304 may be omitted.

For purposes of clarity and not limitation, it shall be assumed that a 90 degree phase shift to the right for data moving left-to-right along a horizontal time axis is used; however, in another example, such a 90 degree phase shift may be to the left. Moreover, for an asymmetric data eye, a shift may not be symmetric about a middle of a data eye, and so a value other than 90 degrees may be used. Furthermore, in another example, data sampling clock signal 209d may be shifted, as indicated by a dashed box phase delay 304, instead of the non-dashed box representation of phase delay 304.

Output from phase delay 304 may be provided as a crossing sampling clock signal 209x for NRZ or zero crossings for example. Crossing sampling clock 209x, having a crossing phase, may be provided to a clock input of crossing slicer 303 for sampling equalized received signal 119e responsive to frequency and phase of such crossing sampling clock signal 209x to provide crossing samples 313. Likewise, data sampling clock 209d, having a data phase, may be provided to a clock input of each of slicers 301 and 302 for sampling equalized received signal 119e responsive to frequency and phase of such data sampling clock signal 209d to respectively provide data samples 311 and peak samples 312.

A PI, such as PI 210 for example, may be configured to divide up a period or half-period or other UI of a data eye into a number of different increments. A PI 210 may have a resolution which is a fraction of a UI, for example a $\frac{1}{16}$th, $\frac{1}{32}$nd, $\frac{1}{64}$th, or other smaller UI fractional resolution. Thus, waveform edges may be spaced-apart by a $\frac{1}{16}$th or smaller fraction of a UI for example to provide a dense distribution. For purposes of clarity by way of non-limiting example, a UI may be equally divided into 128 increments provided by ticks or relative phase resolution positions 0 through 127 for data and crossing samples. Similarly, a dynamic range of amplitude of a data eye may be divided into a number of different increments by a peak slicer.

Deserialized samples provided to a phase detector are provided in parallel. For example, suppose such deserialized samples are provided in parallel for 32 symbols, which represent 16 transitions. If, for example, all 16 transitions indicate phase should be increased by one tick, namely 16 up ticks, then output of a phase detector may be configured for example to output a +16. In another example all 16 transitions may indicate phase should be decreased by one tick, namely 16 down ticks, then output of such a phase detector may be configured for example to output a −16. For purposes of clarity by way of non-limiting example, a dynamic range of amplitude of a PD may be divided into 33 levels from −16 to +16, including a zero level in the middle. Generally, for a bang-bang PD, sampling over a period T, namely 180 degrees, of a data eye is used with edge detection or sampling at T/2, namely a 90 degree shift from a data sampling position, to provide crossing samples different from data samples. Thus, for each tick in a UI, a value from −16 to +16, inclusive, in the above example, may be output by a bang-bang phase detector to indicate whether phase should decreased or increased, respectively. Of course, for sampling in a middle region for data or crossing, some transitions of such 16 possible transitions will be positive and some other transitions of such 16 possible transitions will be negative.

Data slicer 301 may be configured to provide data samples 311 to indicate whether a sampling phase of a data sampling clock signal 209d is in a middle region or median of a data eye. Peak slicer 302 may be configured to provide peak samples 312 to indicate amplitude of such a data eye at a sampling phase of such a data sampling clock signal 209d. Lastly, a crossing slicer 303 may be configured to provide crossing samples 313 to indicate whether a sampling phase of a crossing sampling clock signal 209x is in a middle region of a data crossing or edge of such a data eye. Along those lines, a PI 210 may be swept tick-by-tick for each of such 128 ticks in the above example to characterize data eyes, or some other progression may be used.

Generally, system performance of a receiver 126 is enhanced when sampling at or sufficiently close to an optimum sampling point. For a SerDes environment, data recovery is enhanced by sampling symbols at a phase position having a maximum opening of an eye ("maximum eye opening phase or position"). At such maximum eye opening phase position, a signal-to-noise ratio ("SNR") may be at a maximum. For a perfectly symmetric eye without any layout/routing or any other circuit mismatch, a maximum eye opening phase position corresponds to data symbols being sampled ½ UI away from a corresponding data crossing. However, in practice, due to asymmetric eyes and/or different delays, such as due to circuit mismatches for example, on data crossings, data symbols may be sampled at locations other than ½ UI away from a corresponding data crossing for an optimum sampling point for such data samples.

Along those lines, sample position tuning may be used. Such sample position tuning may be used to adjust a PI 210 to sample at an optimum or sufficiently close to an optimum sampling phase to improve performance. Such sample position tuning may include detecting an optimum phase location and correcting data slicer sampling, peak slicer sampling, and crossing slicer sampling by adjusting phase of a phase clock signal 207 so a sampling phase clock signal 207 or sampling clock signal 209 sufficiently matches such optimum phase location to correct for data crossing issues due to mismatched delays. Such optimum phase sampling position may be determined for a symmetric or an asymmetric data eye.

Figure 4:
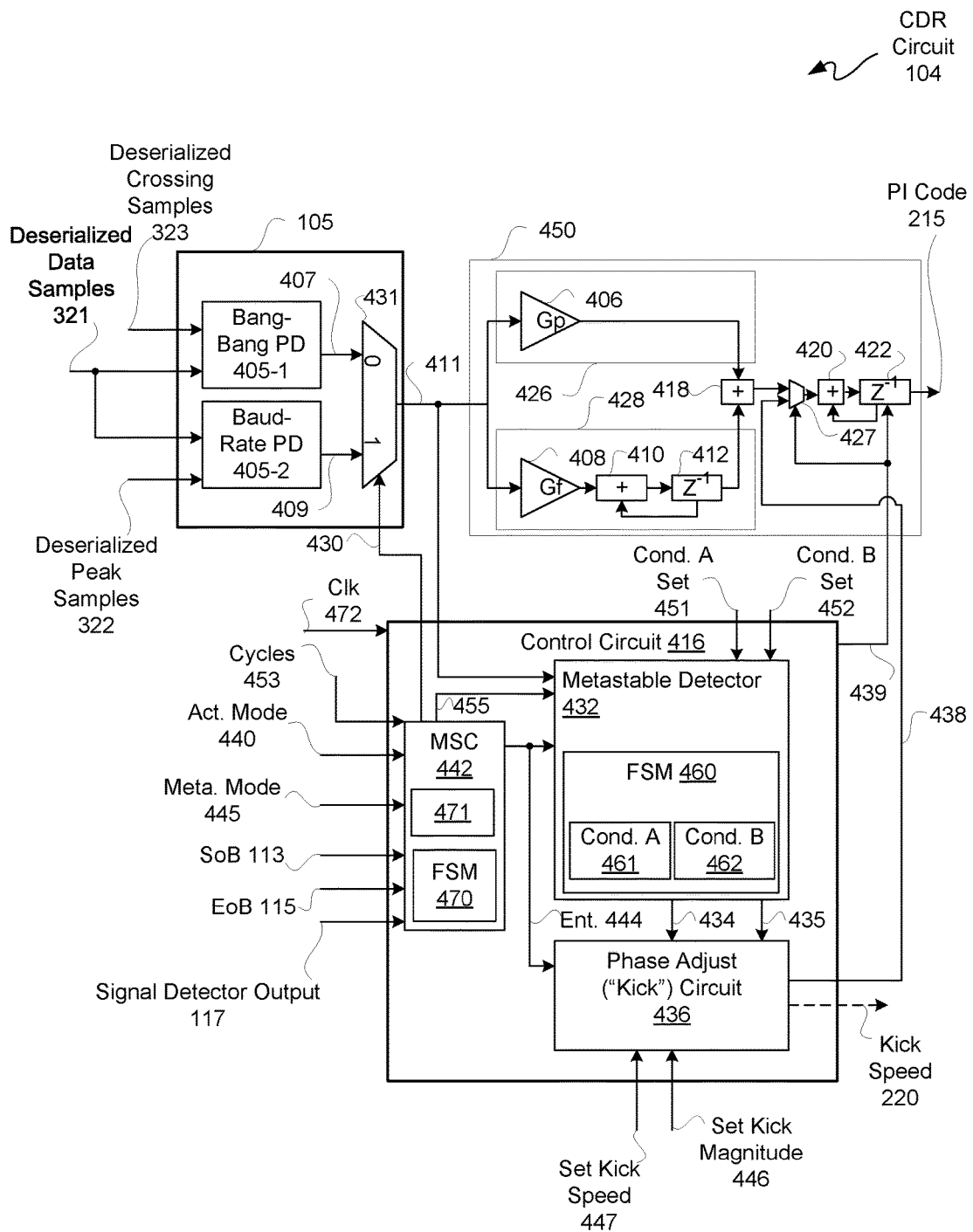
FIG. 4 is a block-circuit diagram depicting an example of a clock data recovery ("CDR") circuit.

FIG. 4 is a block-circuit diagram depicting an example of a CDR circuit 104, such as for receiver 126. CDR circuit 104 of FIG. 4 is further described with simultaneous reference to FIGS. 1 through 4.

CDR circuit 104 in this example is configured to operate in any one of four Operational Modes. In this example, only one of such Operational Modes is active at a time. Furthermore, not all four Operational Modes need be present for operation of CDR circuit 104. For example, if Operational Mode 4, described below in additional detail, is omitted, then baud-rate phase detector 405-2, multiplexer 431, and select signal 430 circuitry may all be omitted, as well as peak slicer 302 and other associated circuitry for generating peak samples 312 and deserialized peak samples 322.

However, each of Operational Modes 1 through 4 may be present, as each may have a use as may vary from implementation-to-implementation. Accordingly, for purposes of clarity by way of example and not limitation, a CDR circuit 104 is described having each of Operational Modes 1 through 4.

CDR circuit 104 may be programmed to use either or both of the following Conditions A and B, which are resolvable within the amount of time of a preamble of a packet, to determine whether or not to kick or nudge phase of a sampling clock signal. Whether either or both of these Conditions A and B are used, and if either, which one, may be programmable by a user.

Along those lines, if Condition A 461 set signal 451 is asserted to metastable detector 432, then Condition A 461 is used. If Condition B 462 set signal 452 is asserted to metastable detector 432, then Condition B 462 is used. And, if both Condition A 461 set signal 451 and Condition B 462 set signal 452 are asserted to metastable detector 432, then both Conditions A and B are used by metastable detector 432.

Condition A 461, which may be activated by a user by assertion of Condition A 461 set signal 451 provided to metastable detector 432 to set a register thereof, has two states to be true for metastable detector 432 in an operative mode to cause a phase adjust circuit ("kick circuit") 436 to provide a kick or nudge via kick phase signal 438 responsive to assertion of lock/metastable state detected ("dithering") signal 434 by metastable detector 432. If a current or instant CDR circuit 104 cycle output from a bang-bang PD 405-1 has a different sign from a previous CDR circuit 104 cycle output from such bang-bang PD 405-1, namely indicating dithering 434 for a lock or a metastable condition for successive cycles of clock signal 472, then a two-cycle dithering state in a finite state machine ("FSM") 460 of metastable detector 432 is set true or detected in metastable detector 432. Otherwise, such a two-cycle dithering state is set false or not detected in FSM 460 for Condition A 461.

If a dithering state is true for Condition A 461, then FSM 460 determines whether both such instant CDR circuit 104 cycle and such previous CDR circuit 104 cycle outputs for data amplitudes are non-zero, namely whether a non-zero state is true. If input to delay element 422 for producing a PI code 215 is not active, such as when no equalized received signal 119e is present, then at least one of such current and previous cycle outputs would be zero, meaning a non-zero state of FSM 460 is false. Without this non-zero check for both of such current and previous cycle outputs, a false positive may result when no signal is present. However, for processing a signal dithering in a lock or a metastable condition, magnitudes of both of such current and previous cycle outputs from bang-bang PD 405-1 may be non-zero, namely a non-zero state being true.

Accordingly, for both states of Condition A 461 being true, then metastable detector 432 in an operative mode as activated by an Operational Mode may assert dithering signal 434 for a determined direction, as described below in additional detail.

Condition B 462, which may be activated by a user by assertion of Condition B 462 set signal 452 provided to metastable detector 432 to set another register thereof, has just one state in just a current cycle to be true for metastable detector 432 in an operative mode to cause kick circuit 436 to provide a kick or nudge via kick phase signal 438 responsive to assertion of dithering signal 434 by metastable detector 432. If, in a same current CDR circuit 104 cycle, there is at least one up tick and one down tick pair in a set of deserialized samples across multiple deserialized symbols corresponding to a bang-bang PD 405-1 result in one CDR clock cycle, namely indicating dithering in a lock or a metastable condition, then a one-cycle dithering state in FSM 460 of metastable detector 432 is set true or detected in such a bang-bang PD 405-1 result by metastable detector 432. Otherwise, such one-cycle dithering state is set false or not detected in FSM 460 for Condition B 462. Such set of deserialized samples may be deserialized data samples or deserialized crossing samples. A bang-bang PD 405-1 sums up a set of deserialized symbols in one CDR circuit 104 cycle to produce an output in the form of a summation of ticks.

Accordingly, for a one-cycle dithering state of Condition B 462 being true, then metastable detector 432 in an operative mode as activated by an Operational Mode may assert dithering signal 434 for a determined direction, as described below in additional detail. Condition A 461 is a less aggressive determination for dithering than Condition B 462, as Condition A 461 takes more cycle time to determine than Condition B 462. Additionally, Condition A 461 is less aggressive than Condition B 462, because Condition A works on the summation of ticks per cycle (i.e., an averaging effect), whereas Condition B works by looking for a single abnormal tick.

Again, during a lock condition, a nudge or kick to phase of a PI code only slightly, if even discernably, impacts operation of CDR circuit 104, as CDR circuit 104 immediately returns to a phase sampling position for such lock condition. However, during a metastable condition, a nudge or kick to phase of a PI code causes such sampling position to drift toward a phase for a lock condition.

After activation of an Operational Mode, such Operational Mode may be active for a number of cycles before returning to an inactive status. The number of CDR circuit 104 cycles a bang-bang PD 405-1 or a baud-rate PD 405-2 is active for may be programmably set by cycles signal 453 provided to set a counter 471 of mode select circuit 442. Such counter 471, which may be coupled to receive a cyclic or clock signal 472 for operation of CDR circuit 104, may count up to such set number of cycles before deasserting enter-into-mode signal 444 for Operational Modes 1, 2, or 3 to exit such Operational Mode. For Operation Mode 4, enter-into-mode signal 444 is not asserted, and so not deasserted after counting to a set number of cycles before exiting such Operational Mode 4. The number of cycles may generally be any integer number greater than zero, and so at least one cycle of a PD output may be obtained for a CDR circuit cycle responsive to clock signal 472.

Registers of kick circuit 436 may be used to receive programmed settings for kick speed and kick magnitude respectively responsive to set kick speed signal 447 and set kick magnitude signal 446. An optional set kick speed signal 447 refers to an increase or decrease in frequency of a reference or sampling clock frequency, as previously described, which can be used by adjusting an adjustable delay in a PLL 212 or an adjustable divider in a clock divider 206 by such setting. A kick magnitude signal 446 refers to one or more ticks to increment or decrement a PI code 215 by kick phase signal 438. In this example, a mux 427 is located just before adder 420, where inputs to such mux 427 are kick phase signal 438 and output of adder 418. Output of such a mux 427 may be an input to adder 420, and an override signal 439 may be provided to such a mux 427 as a control select signal.

In addition to causing kick circuit 436 to provide a phase kick for a downstream delay element 422, assertion of dithering signal 434 by metastable detector 432 may be provided with a kick direction signal 435. Kick direction depends on a sum of the total phase detected output per CDR circuit 104 cycle. If output of bang-bang PD 405-1 for a CDR circuit 104 cycle is positive, such as 0, +1, +2, etc., direction of a kick is to the right or later in phase as indicated in kick phase signal 438. If, however, output of bang-bang PD 405-1 is negative, such as −1, −2, etc., direction of a kick is to the left or earlier in phase as indicated in kick phase signal 438. Optionally, the output of a PD could be averaged over a programmable number of cycles to reduce the chance of a spurious cycle of PD output due to random jitter or ISI. Metastable detector 432 may be configured responsive to output of bang-bang PD 405-1 to provide a kick direction signal 435 indicating either a positive or a negative value of output of bang-bang PD 405-1 for phase direction adjustment in PI code 215 by kick phase signal 438.

A metastable condition and detection thereof has been described with reference to output of bang-bang PD 405-1, and not baud-rate PD 405-2. While it is possible for a bang-bang PD 405-1 to be in a metastable condition, a baud-rate PD 405-2 does not have a metastable condition problem like a bang-bang PD 405-1.

CDR circuit 104 includes phase detectors circuit 105, a digital loop filter 450, and a control circuit 416. Inputs of bang-bang PD 405-1 of phase detectors circuit 105 are respectively coupled to receive deserialized data samples 321 and deserialized crossing samples 323. Inputs of baud rate PD 405-2 of phase detectors circuit 105 are respectively coupled to receive deserialized data samples 321 and deserialized peak samples 322.

Outputs of bang-bang PD 405-1 and baud rate PD 405-2 are respectively provided as data inputs to multiplexer 431 of phase detectors circuit 105. Multiplexer 431 is further configured to receive a select signal 430 from mode select circuit 442 of control circuit 416. Default of select signal 430 is a logic 0 in this example to select output from bang-bang PD 405-1. However, if Operational Mode 4 is invoked, as described below in additional detail, select signal 430 is set to a logic 1 in this example to select output from baud-rate PD 405-2 to clear a possible metastable condition.

An output of multiplexer 431 is coupled to digital loop filter 450 and to metastable detector 432 of control circuit 416. An output of digital loop filter 450 provides a PI code signal 215, which is coupled to an input of PI 210. An output of PI 210 provides a phase-sampling clock signal, as described above.

In this example, digital loop filter 450 includes a gain circuit 406, a gain circuit 408, an adder 410, a delay element 412, an adder 418, an adder 420, and an adjustable delay element 422. Gain circuit 406 implements a phase path 426. Gain circuit 408, adder 410, and delay element 412 implement a frequency path 428. Inputs to gain circuits 406 and 408 are coupled to an output of multiplexer 431. An output of gain circuit 406 is coupled to an input of adder 418. An output of gain circuit 408 is coupled to an input of adder 410. An output of adder 410 is coupled to an input of delay element 412. An output of delay element 412 is coupled to another input of adder 410 and to another input of adder 418. An output of adder 418 is coupled to an input of adder 420. An output of adder 420 is coupled to an input of adjustable delay element 422. Another input of adjustable delay element 422 is coupled to receive kick phase signal 438 from kick circuit 436 of control circuit 416.

An output of adjustable delay element 422 is coupled to another input of adder 420 and to an input of PI 210.

In operation for Operational Modes 1 through 3, phase detector circuit 105 generates a bang-bang detect result 407, namely a net phase or phase difference detected result ("detect result") on deserialized data and crossing samples. By a phase difference detected for a detect result by a bang-pang phase detector, it is generally meant a detected phase error or net phase difference, whether with a positive or negative sign indicating a leading or lagging phase difference, between data samples and an associated crossing sample or between a data sample and associated crossing samples, namely generally one or more data samples and one or more crossing samples. In this example, bang-bang phase detector 405-1 generates an individual phase detect result based on a pair of data samples and a crossing sample in corresponding deserialized data and crossing samples. Bang-bang phase detector 405-1 combines individual phase detect results to generate a net phase detect result as a bang-bang detect result 407. Phase detector circuit 105 outputs a selected phase-detect output 411, such as a net phase detect result of a bang-bang detect result 407 to digital loop filter 450 and metastable detector 432 of control circuit 416.

In operation for Operational Mode 4, when select signal 430 in this example is set to a logic 1, phase detector circuit 105 generates a baud-rate detect result 409, namely a net phase or phase difference detected result ("detect result") on deserialized data and peak samples. By a phase difference detected for a detect result by a baud-rate phase detector, it is generally meant a detected phase error or net phase difference, whether with a positive or negative sign indicating a leading or lagging phase difference, between data samples and an associated peak sample or between a data sample and associated peak samples, namely generally one or more data samples and one or more peak samples. In this example, baud-rate phase detector 405-2 generates an individual phase detect result based on a pair of data samples and a peak sample in corresponding deserialized data and peak samples. Baud-rate phase detector 405-2 combines individual phase detect results to generate a net phase detect result. Phase detector circuit 105 outputs a selected phase-detect output 411, such as a net phase detect result of a baud-rate detect result 409 to digital loop filter 450, and bypasses a metastable detector 432 of control circuit 416 as described below in additional detail. After counting a set number of cycles set by number of cycles setting signal 453, mode select circuit 442 toggles select signal 430 back to a logic 0. Within such number of cycles, a metastable condition, if present, is cleared.

Digital loop filter 450 performs a CDR algorithm to adjust a PI code based on a phase detect result signal output from phase detectors circuit 105. Gain circuit 406 applies a phase gain (Gp) to such a phase detect result signal. For example, gain circuit 406 can implement a left-shift operation to apply a phase gain. Gain circuit 408 applies a frequency gain (Gf) to such a phase detect result signal. For example, gain circuit 408 can implement a left-shift operation to apply a frequency gain. Output of gain circuit 408 is integrated by adder 410 and delay element 412. An integrated output of frequency path 428 is added to output of phase path 426 by adder 418. Output of adder 418 or kick phase signal 438, as selected by mux 427 responsive to override signal 439, is integrated by adder 420 and delay element 422.

Control circuit 416 can be implement such that the above described digital loop filter 450 is overridden so as to not adjust PI code signal 215 output by delay element 422 by asserting an override signal 439. An override signal 439 may be asserted by control circuit 416 in order to pause digital loop filter 450, such as to kick the current phase responsive to an adjustment from kick phase signal 438.

To recapitulate, a receiver 126 includes a CDR circuit 104 having a phase detector circuit 105. Such phase detector circuit 105 has a bang-bang PD 405-1 configured to receive deserialized data samples 321 and deserialized crossing samples 323 to generate a bang-bang detect result 407. Such phase detector circuit 105 has a baud-rate phase detector 405-2 configured to receive deserialized data samples 321 and deserialized peak samples 322 to generate a baud-rate detect result 409. Such phase detector circuit 105 has a multiplexer 431 configured to select responsive to a select signal 430 either a bang-bang detect result 407 or a baud-rate detect result 409 as a selected phase-detect output 411. A control circuit 416 is configured to generate select signal 430; more particularly, a mode select circuit 442 is configured to generate a select signal 430, as described below in additional detail.

Again, control circuit 416 may include a metastable detector 432, a kick circuit 436, and a mode select circuit 442. Control circuit 416 can be implemented using various digital logic circuits and registers to perform the functions described herein. Accordingly, such circuits are not described in unnecessary detail for purposes of clarity and not limitation.

Mode select circuit 442 includes an FSM 470 for selecting of an Operational Mode of Operational Modes 1 through 4 responsive to activate mode signal 440 and metastable mode signal 445. Table I is an example truth table for mode selection for mode select circuit 442.

| Act. Mode Signal 440 | Meta. Mode Signal 445 | Op Mode. | Brief Description |
| --- | --- | --- | --- |
| 0 | 0 | 4 | Baud-rate Mode to clear potential metastable state |
| 0 | 1 | 3 | Signal Detector Mode to clear potential metastable state |
| 1 | 0 | 2 | End-of-Burst Mode to clear potential metastable state |

-continued

| Act. Mode Signal 440 | Meta. Mode Signal 445 | Op Mode. | Brief Description |
| --- | --- | --- | --- |
| 1 | 1 | 1 | Start-of-Burst Mode to clear potential metastable state |

Again, not all of Operational Modes 1 through 4 need be supported by control circuit 416 in an example implementation. For example, a control circuit 416, including a metastable detector 432 and a kick circuit 436, may have a mode select circuit 442 configured to activate metastable detector 432 and kick circuit 436, responsive to assertion of enter-into-mode ("Ent.") signal 444 by mode select circuit 442 as provided to metastable detector 432 and kick circuit 436. Mode select circuit 442 may be configured, such as for setting states in FSM 470 for example, responsive to receipt of an asserted one of an SoB signal 113 or an EoB signal 115 in order to enter a metastable detection-kick mode, namely assertion of enter-into-mode signal 444, for either of Operational Modes 1 or 2, respectively. Additionally, if a signal detector 129 is coupled to provide a signal detector output 117 to mode select circuit 442, Operational Mode 3 may be selected from Operational Modes 1 through 3.

For purposes of clarity by way of example and not limitation, an example with all four Operational Modes is described, even though fewer than all four Operational Modes may be present, as described herein. Along those lines, some situations in which an Operational Mode may be used are described in order to provide some context for selection of one Operational Mode over another.

For each of Operational Modes 1 through 3, control circuit 116, and more particularly for this example mode select circuit 442, is configured to select output from bang-bang PD 405-1. In other words, responsive to received activate mode signal 440 and metastable mode signal 445, mode select circuit 442 is configured to not assert select signal 430. For an Operational Mode 1, 2, or 3, mode select circuit 442 does not assert control select signal 430, and so in this example a selected phase-detect output 411 is a bang-bang detect result 407 output from bang-bang PD 405-1, as previously described.

In communication environments with one or more channels sending bursts of packets or other data transmission containers, Operational Mode 1 may be selected for use. For example, even though phase sampling may be correct for sampling burst data on a channel 1, channel 2 may not have the same phase relationship as channel 1. This means that a different phase sampling position is to be determined for channel 2. This is just one example context, and other same or similar context may apply for Operational Mode 1, as well as any of Operational Modes 2, 3, or 4.

If Operational Mode 1 is selected by a user setting of activation mode signal 440 and metastable mode signal 445, which may respectively be provided to registers of mode select circuit 442 for FSM 470, control circuit 416, or more particularly mode select circuit 442, is configured to activate metastable detector 432 and kick circuit 436 responsive to assertion of an SoB signal 113 to enter a metastable detection-kick mode by assertion of enter-into-mode signal 444.

SoB signal 113 may be obtained from MAC circuitry 124, such as known MAC circuitry for example. Because SoB signal 113 is provided at the start of a burst, phase sampling positions may be informed during a preamble of such burst so as to correctly sample data and crossings of bursted data. Along those lines, when such SoB signal 113 is asserted, an activated metastable detector 432, responsive to assertion of enter-into-mode signal 444 in response to assertion of SoB signal 113, can detect a direction to assert via kick direction signal 435 responsive to a selected phase-detect output 411 received by metastable detector 432.

Latency for Operational Mode 1 may be higher than any of Operational Modes 2 through 4, as SoB signal 113 would be sent at the start of a burst of any "new" packet. In other words, upon arriving at a start of a burst for a "new" packet, such as on a "new" channel, metastable detector 432 may be configured to assert dithering signal 434 regardless whether in a locked condition or a metastable condition in order to ensure a metastable condition is not entered upon entering a "new" channel. Accordingly, responsive to assertion of dithering signal 434 and a direction of kick direction signal 435, an activated kick circuit 436 asserts kick phase signal 438, and optionally may assert a kick speed signal 220. This latter assertion may be used for channels operating at slightly different frequencies.

Once a control circuit 116 of CDR circuit 104 is activated for any of Operational Modes 1 through 3, a metastable or locked condition detected by an activated, and not held as in Operational Modes 2 or 3, metastable detector 432 causes CDR circuit 104 to incrementally move or adjust a PI code of a PI code signal 215 by a "nudge" or a "kick" in phase by kick circuit 436 as described herein. After a set number of cycles of operation of CDR circuit 104 in any of Operational Modes 1 through 3, metastable detector 432 and kick circuit 436 may be deactivated by deassertion of enter-into-mode signal 444.

In other words, after just one phase kick in any of Operational Modes 1 through 3 by assertion of kick phase signal 438, power consumption and performance may be enhanced by not continuing such phase adjustment as CDR circuit 104 would likely be in or arrive at a locked condition for continued sampling. Operational Mode 4 may be used to temporarily operate CDR circuit 104 with a baud-rate detect result 407 before switching to operation with a bang-bang detect result 409, as described below in additional detail.

If Operational Mode 2 is selected by a user setting of activation mode signal 440 and metastable mode signal 445, which may respectively be provided to registers of mode select circuit 442 for FSM 470, control circuit 416, or more particularly mode select circuit 442, is configured to activate metastable detector 432 and kick circuit 436 responsive to assertion of EoB signal 115 followed by signal detection to enter a metastable detection-kick mode by assertion of enter-into-mode signal 444.

In Operational Mode 2, a signal detector 129 is configured to generate a signal detector output 117 responsive to a differential input, such as for example received signal 119 prior to equalization or even prior to any processing to provide a received signal 119 to a first in line of a CTLE 203 or AGC 202. Signal detector 129 may be coupled to provide such signal detector output 116 to control circuit 116, and in this example more particularly mode select circuit 442.

Control circuit 116, or more particularly in this example mode select circuit 442, may be configured to activate metastable detector 432 and kick circuit 436 responsive to assertion of EoB signal 115. Furthermore, responsive to assertion of EoB signal 115, a hold signal 455 may be asserted by mode select circuit 442 to hold metastable detector 432 from processing input from signal 411, and thus prevent assertion of dithering signal 434 and direction signal 435 until a next burst is received. EoB signal 115 may be obtained from MAC circuitry 124, such as known MAC circuitry for example. However, by activating metastable detector 432, as well as kick circuit 436, responsive to the end of a previous burst on a channel, metastable detector 432, as well as kick circuit 436, are already activated for receipt of a next burst on such channel in order to reduce latency to lock to such next burst.

After activation of metastable detector 432 and kick circuit 436, responsive to signal detector output 117 indicating receipt of a packet or other signal, mode select circuit 442, by transitioning state in FSM 470 responsive to such signal detector output, may cause metastable detector 432 and kick circuit 436 to enter into metastable detection-kick mode by deasserting hold signal 455 to release metastable detector 432. Mode select circuit 442 may count cycles after release of such hold signal 455 in order to determine when to deassert enter-into-mode signal 444.

Signal detector 129 may observe a differential input 119 to receiver 126 at a front-end thereof, namely early in a reception process. Signal detector 129 may be configured to return an indicator showing whether such differential input is toggling or not. Even though EoB signal 115 is provided at the end of a current burst, phase sampling positions may be informed at an early detection point, even as early as a first symbol, for a next burst responsive to signal detector output 117 to correctly sample data and crossings of such next burst. This allows Operational Mode 2 to have a lower latency than Operational Mode 1, and like Operational Mode 1, Operational Mode 2 may be used in communication environments with one or more channel sending bursts of packets or other data transmission containers. Generally, individual packets are not sent, but are provided in bursts of three or more packets; however, in such event of a channel configured to send a single packet at a time, any of Operational Modes 1 through 4 may still be used. However, for purposes of clarity by way of example and not limitation, a burst or bursts of packets is described.

To reduce latency to lock when such EoB signal 115 is asserted in Operational Mode 2, an activated metastable detector 432, responsive to assertion of enter-into-mode signal 444, is ready for immediate operation subject to release of hold signal 455. Thus, when hold signal 455 is released, metastable detector 432 can immediately detect a direction to assert kick direction signal 435 responsive to a selected phase-detect output 411 received by metastable detector 432 for a detected locked or metastable condition.

In order to ensure a metastable condition is not present as between a detected locked or metastable condition, a dithering signal 434 and a direction signal 435, for assertion of a kick or phase adjustment signal in a particular direction, may be asserted. An activated kick circuit 436 asserts kick phase signal 438, and optionally may assert a kick speed signal 220. This latter assertion may be used for channels operating at slightly different frequencies.

While Operational Mode 2 may have less latency than Operational Mode 1, because Operational Mode 2 is dependent on a "raw" differential input signal, such as received signal 119 for example, a channel with too much noise for efficient operation in Operational Mode 2 may be an issue. In other words, when a high speed received signal 119 has a high loss and/or has a lot of ISI and/or other noise, amplitude of such signal is reduced, making detection more problematic. Failure to detect receipt of such a received signal 119 may result in a metastable detector 432 not being triggered.

If Operational Mode 3 is selected by a user setting of activation mode signal 440 and metastable mode signal 445, which may respectively be provided to registers of mode select circuit 442 for FSM 470, control circuit 416, or more particularly mode select circuit 442, is configured to assert enter-into-mode signal 444 and hold signal 455 upon signal detector output 117 indicating no signal detected. Such indication of no signal detected is used to activate metastable detector 432 and kick circuit 436, while holding metastable detector 432, and consequently kick circuit 436, from cycling as previously described with reference to Operational Mode 2 and thus not repeated.

Like in Operational Mode 2, in Operational Mode 3, reliance is on signal detector output 117 to toggle indicating presence of a signal, such as indicating presence of a first packet in a burst of packets, for triggering release of hold signal 455. Use of signal detector output 117 to release metastable detector 432, and thus subsequent operation, is the same in Operational Mode 3 as previously described for Operational Mode 2, and not repeated.

Operational Mode 3 may have less latency than Operational Mode 2 because Operational Mode 3 does not necessarily wait until assertion of an EoB signal 115. However, because Operational Mode 3 is even more dependent on a "raw" differential input signal than Operational Mode 2, a channel with too much noise for efficient operation in Operational Mode 3 may be an issue.

For Operational Mode 4, control circuit 116, and more particularly for this example mode select circuit 442, is configured responsive to received activation mode signal 440 and metastable mode signal 445 to select output from baud rate PD 405-2. For an Operational Mode 4, mode select circuit 442 asserts control select signal 430, and so in this example a selected phase-detect output 411 is a baud-rate detect result 409 output from baud-rate PD 405-2, as previously described.

In Operational Mode 4, control circuit 116, or more particularly mode select circuit 442 in this example, is configured to deassert or maintain deasserted enter-into-mode signal 444 responsive to assertion of EoB signal 115 for a previous burst, or more particularly a packet of a previous burst. Accordingly, when packets of a next burst arrive, CDR circuit 104 locks using a baud-rate detect result 409 of baud-rate PD 405-2, in effect bypassing metastable detector 432 and kick circuit 436 of control circuit 116.

A baud-rate PD 405-2 does not have a metastable issue as in a bang-bang PD 405-1, but a baud-rate PD 405-2 also is slower to lock than a bang-bang PD 405-1. Accordingly, after counting a number of cycles, including without limitation a single cycle, by mode select circuit 442, as set by set cycles signal 453, control circuit 116 may be configured to switch to using bang-bang PD 405-1 for operation of CDR circuit 104. Mode select circuit 442 at completion of Operational Mode 4 may be configured to deassert control select signal 430 in order to use bang-bang detect result 407 for operation of CDR circuit 104, which provides quicker locking and stability than baud-rate detect result 409.

In any of Operational Modes 1 through 3, output of delay 422 of CDR circuit 104 may be configured to change a PI code by an increment up or down of PI code signal 215, as previously described. This is done with metastable detector 432 and kick circuit 436 in metastable detection-kick mode. In such a metastable detection-kick mode, metastable detector circuit 432 is operative to determine a direction to adjust a data phase of a selected phase-detect output 411, more particularly a bang-bang detect result 407, and kick circuit 436 is operative to provide a positive or a negative value via kick phase signal 438 responsive to such direction provided via direction signal 435, as previously described.

For purposes of clarity by way of example and not limitation, it has been assumed that an Operational Mode of Operational Modes 1 through 4 is selected and CDR circuit 104 continues to run in such selected Operational Mode. However, in another implementation, a first Operational Mode of Operational Modes 1 through 4 may be selected for one or more cycles of CDR circuit 104, followed by selection of a second Operational Mode of a remainder of such Operational Modes in order to select a different operation mode than such first Operational Mode.

In the past, an average of phase detect results was determined over a number of CDR circuit cycles, and such average was compared to a threshold to determine a lock condition. However, rather than taking the time to determine such a running average and then compare such average to a threshold, anytime dithering is detected, a selected one of Operational Modes 1 through 3 may be used to clear a metastable state if present; or if Operation Mode 4 is used, any such metastable state if present may be cleared prior to continued operation.

Figure 5:
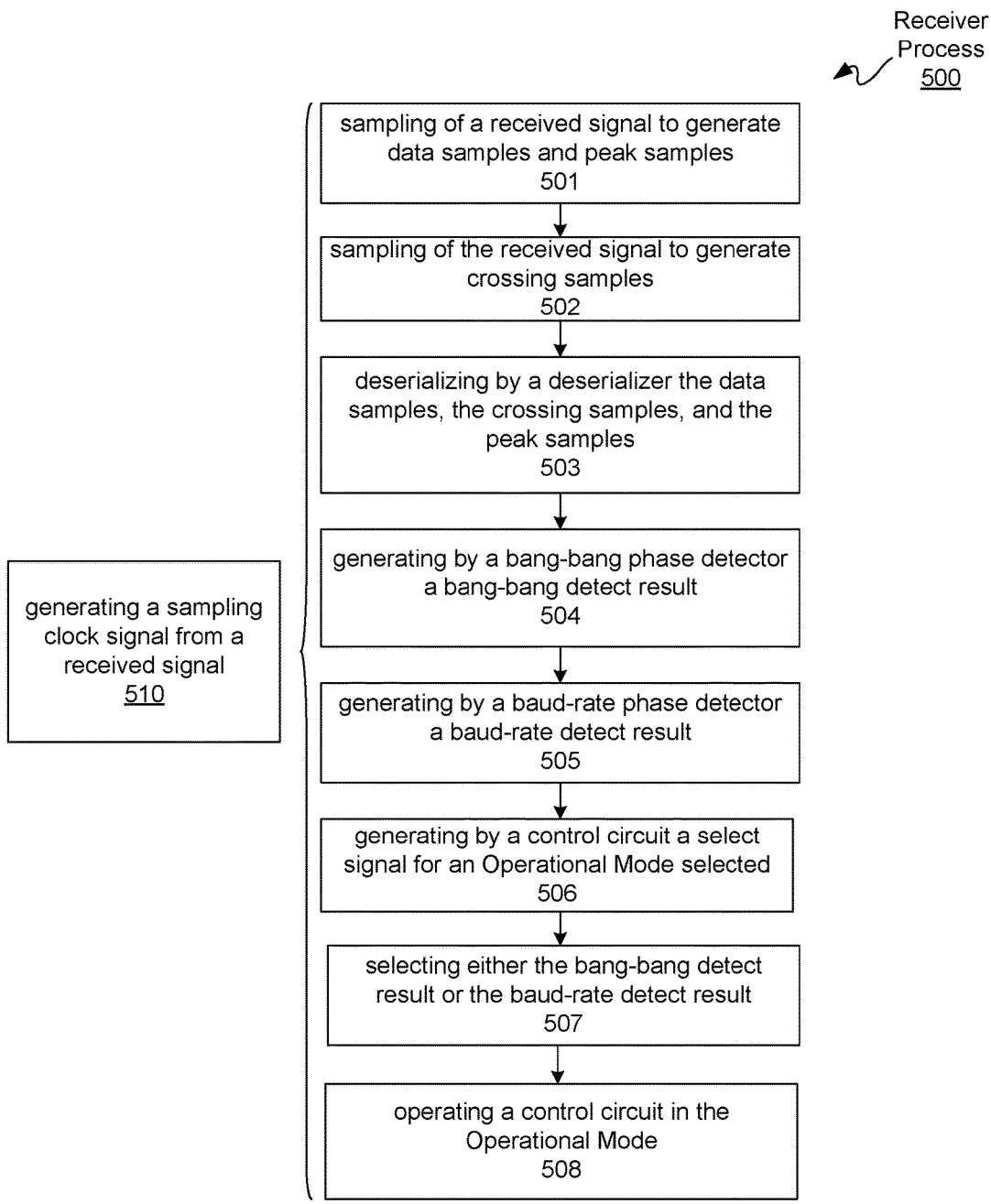
FIG. 5 is a flow diagram depicting an example of a receiver process.

FIG. 5 is a flow diagram depicting an example of a receiver process 500. Receiver process 500 is described with simultaneous reference to FIGS. 1 through 5.

At 510, a sampling clock signal 207 or 209 is generated from a received signal 119 or 119e with a CDR circuit 104. Such generating of a sampling clock signal at 510 may include operations 501 through 508, as described below in additional detail.

At 501, a received signal 119e is sampled to generate data samples 311 and peak samples 312 responsive to a data clock signal 209d having a data phase. At 502, such received signal 119e is sampled to generate crossing samples 313 responsive to a crossing clock signal 209x having a crossing phase. Again, crossing clock signal 209x in this example is a phase-shifted version of data clock signal 209d or phase-shifted relative to data clock signal 209d.

At 503, a deserializer 208 deserializes data samples 311, crossing samples 313, and peak samples 312 to respectively provide deserialized data samples 321, deserialized crossing samples 323, and deserialized peak samples 322. At 504, a bang-bang detect result 407 may be generated from deserialized data samples 321 and deserialized crossing samples 323 by a bang-bang phase detector 405-1. At 505, a baud-rate detect result 409 may be generated from deserialized data samples 321 and deserialized peak samples 322 by a baud-rate phase detector 405-2.

At 506, a control circuit 416 may generate a select signal 430 for a selected mode of operation from a plurality of operational modes, such as any of Operational Modes 1 through 4. At 507, either bang-bang detect result 407 or baud-rate detect result 409 may be selected as a selected phase-detect output 411 from a multiplexer 431 responsive to select signal 430.

At operation 508, such control circuit 416 may be operated in such a selected mode of operation. Operation of control circuit 416 for operation 508 is described for Operational Modes 1 through 4 respectively with reference to FIGS. 6-1 through 6-4.

Figures 1, 6:
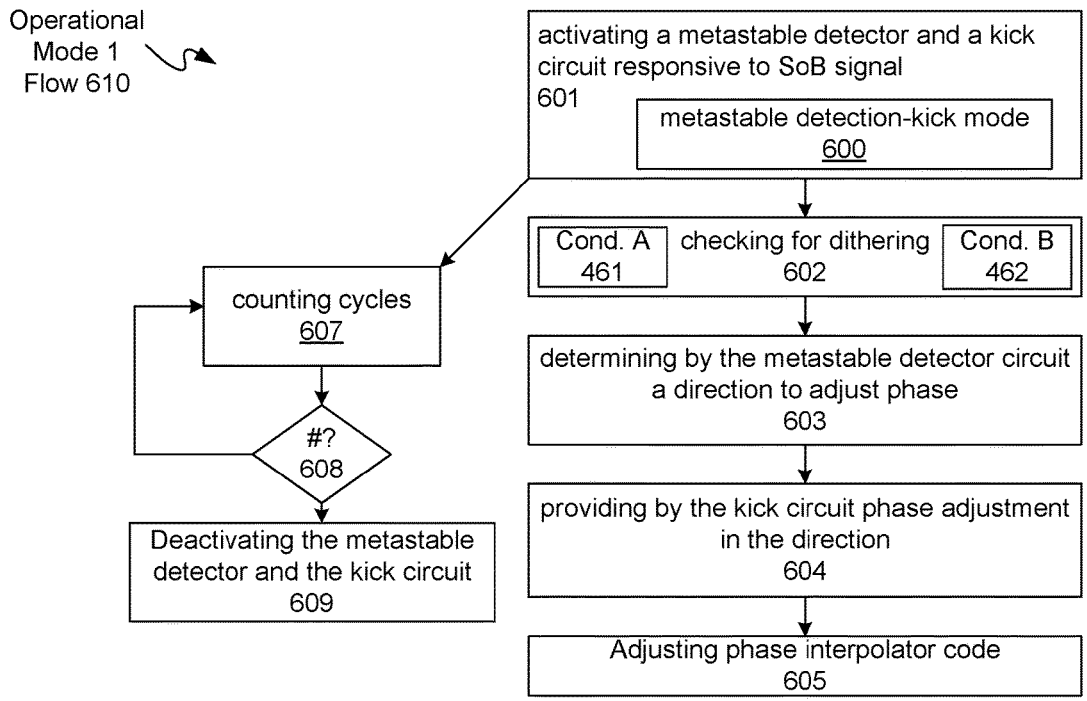
Figures 2, 6:
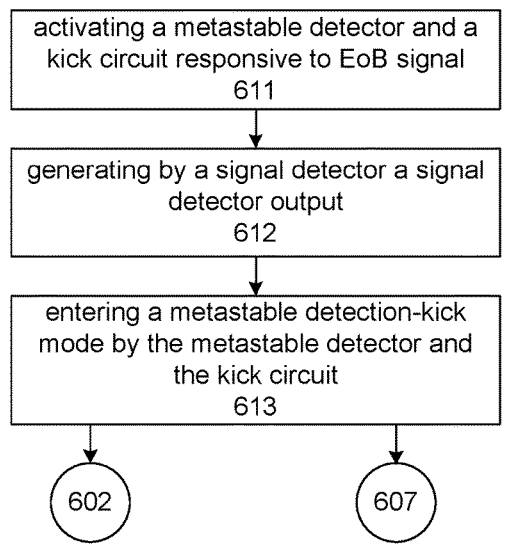
Figures 3, 6:
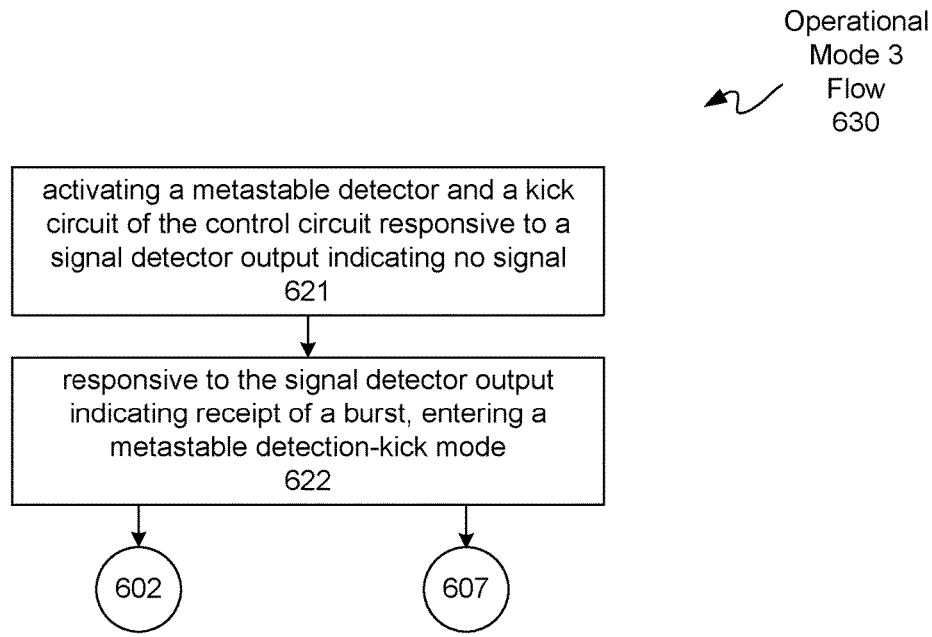
Figures 4, 6:
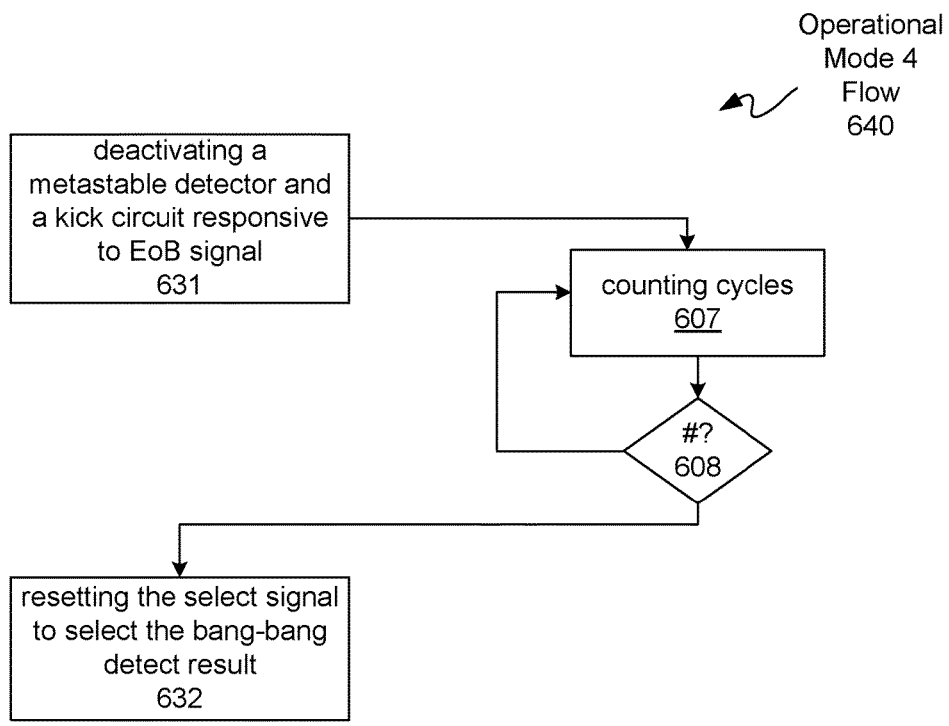

FIG. 6-1 is a flow diagram depicting an example of an Operational Mode 1 flow 610. FIG. 6-2 is a flow diagram depicting an example of an Operational Mode 2 flow 620. FIG. 6-3 is a flow diagram depicting an example of an Operational Mode 3 flow 630. FIG. 6-4 is a flow diagram depicting an example of an Operational Mode 4 flow 640. With reference to FIGS. 1 through 6-4, Operational Mode flows 610 through 640 are further described.

For operation of control circuit 416 for receipt of bang-bang detect result 407 for operation in Operational Mode 1, a metastable detector 432 and a kick circuit 436 may be activated responsive to receipt of an SoB signal 113 at operation 601.

For Operational Mode 1, activation at operation 601 automatically causes metastable detector 432 and kick circuit 436 to enter into a metastable detection-kick mode 600, namely release of metastable detector 432. Furthermore, activation at 601 may directly coincide with counting of clock cycles of clock signal 472 up to a cycle number at operation 607. After a set or default cycle number, such as may be set by set cycles signal 453, have been counted as determined at operation 608, then at operation 609 metastable detector 432 and kick circuit 436 may be deactivated for exiting Operational Mode 1. Otherwise, counting of cycles at operation 607 continues during use of Operational Mode 1.

During such counting of clock cycles at operation 607, in Operational Mode 1 a check for dithering may be performed at operation 602. Operating control circuit 416 for receipt of bang-bang detect result 407, metastable detector 432 checks for dithering in such result. Metastable detector 432 may be configured to operate in at least one of a two-cycle condition, namely Condition A 461, or a one-cycle condition, namely Condition B 462, to check for such dithering.

If dithering is detected by metastable detector 432, then metastable detector 432 may be configured to determine a direction for phase adjustment at operation 603 responsive to detection of such dithering. At operation 604, a phase adjustment in such determined direction may be provided. Along those lines, kick circuit 436 may be configured to operate at 604 to provide a phase adjustment in such determined direction.

At operation 605, input to delay 422 of CDR circuit 104 may be adjusted responsive to phase adjustment in a direction responsive to dithering. Along those lines, a PI code 215 may be incremented or decremented by such phase adjustment.

For operation of control circuit 416 for receipt of bang-bang detect result 407 for operation in Operational Mode 2, a metastable detector 432 and a kick circuit 436 may be activated responsive to receipt of an EoB signal 115 at operation 611. At operation 612, a signal detector 129 generates a signal detector output 117 responsive to a differential input 119 associated with an unequalized version of received signal 119*e* to provide signal detector output 117 to control circuit 416.

At operation 613, metastable detector 432 and kick circuit 436 enter into a metastable detection-kick mode, namely release of metastable detector 432, responsive to signal detector output 117 indicating receipt of a data burst. From operation 613, entry into a metastable detection-kick mode 600 may directly coincide with counting of clock cycles of clock signal 472 at operation 607, and operations 607 through 609, as previously described, may be repeated for Operational Mode 2. During such counting of clock cycles at operation 607, in Operational Mode 2 a check for dithering may be performed at operation 602, and operations 602 through 605 may be repeated as previously described.

For operation of control circuit 416 for receipt of bang-bang detect result 407 for operation in Operational Mode 3, a metastable detector 432 and a kick circuit 436 may be activated responsive to receipt of a signal detector output 117 of a signal detector 129 indicating no signal detected at operation 621. After this quiescent period of no signal, later at operation 622, metastable detector 432 and kick circuit 436 may enter into a metastable detection-kick mode, namely release of metastable detector 432, responsive to signal detector output 117 subsequently indicating receipt of a data burst. From operation 622, entry into a metastable detection-kick mode may directly coincide with counting of clock cycles of clock signal 472 at operation 607, and operations 607 through 609, as previously described, may be repeated for Operational Mode 3. During such counting of clock cycles at operation 607, in Operational Mode 3 a check for dithering may be performed at operation 602, and operations 602 through 605 may be repeated as previously described.

For operation of control circuit 416 for receipt of a baud-rate detect result 409 for operation in Operational Mode 4, a select signal 430 is set to select such baud-rate detect result 409 for output from multiplexer 431 to deactivate metastable detector 432 and a kick circuit 436 at 631 responsive to receipt of an EoB signal 115. Counting to a set number at operation 607 and checking a current count at operation 608 may be performed as previously described. Operation in Operational Mode 4 is performed during such counting and before a reset of select signal 430.

At operation 632, after at least one cycle of a baud-rate detect result 409 is counted for set number, select signal 430 may be reset to select bang-bang detect result 407 as selected phase-detect output 411 from multiplexer 431. Accordingly, a set number may be 1, and so only one cycle may be counted at 607. However, generally such a set number may be more than one, so a set number of cycles are counted at 607.

SerDes 122 described above can be implemented within an integrated circuit, such as a field programmable gate array (FPGA) or like type programmable circuit. Because one or more of the examples described herein may be implemented in an FPGA, a detailed description of such an IC is provided. However, it should be understood that other types of ICs may benefit from the technology described herein.

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. As used herein, "include" and "including" mean including without limitation.

Each programmable tile typically includes both programmable interconnect and programmable logic. The programmable interconnect typically includes a large number of interconnect lines of varying lengths interconnected by programmable interconnect points ("PIPs"). The programmable logic implements the logic of a user design using programmable elements that can include, for example, function generators, registers, arithmetic logic, and so forth.

The programmable interconnect and programmable logic are typically programmed by loading a stream of configuration data into internal configuration memory cells that define how the programmable elements are configured. The configuration data can be read from memory (e.g., from an external PROM) or written into the FPGA by an external device. The collective states of the individual memory cells then determine the function of the FPGA.

Another type of PLD is the Complex Programmable Logic Device, or CPLD. A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. In CPLDs, configuration data is typically stored on-chip in non-volatile memory. In some CPLDs, configuration data is stored on-chip in non-volatile memory, then downloaded to volatile memory as part of an initial configuration (programming) sequence.

For all of these programmable logic devices ("PLDs"), the functionality of the device is controlled by data bits provided to the device for that purpose. The data bits can be stored in volatile memory (e.g., static memory cells, as in FPGAs and some CPLDs), in non-volatile memory (e.g., FLASH memory, as in some CPLDs), or in any other type of memory cell.

Other PLDs are programmed by applying a processing layer, such as a metal layer, that programmably interconnects the various elements on the device. These PLDs are known as mask programmable devices. PLDs can also be implemented in other ways, e.g., using fuse or antifuse technology. The terms "PLD" and "programmable logic device" include but are not limited to these exemplary devices, as well as encompassing devices that are only partially programmable. For example, one type of PLD includes a combination of hard-coded transistor logic and a programmable switch fabric that programmably interconnects the hard-coded transistor logic.

Figure 7:
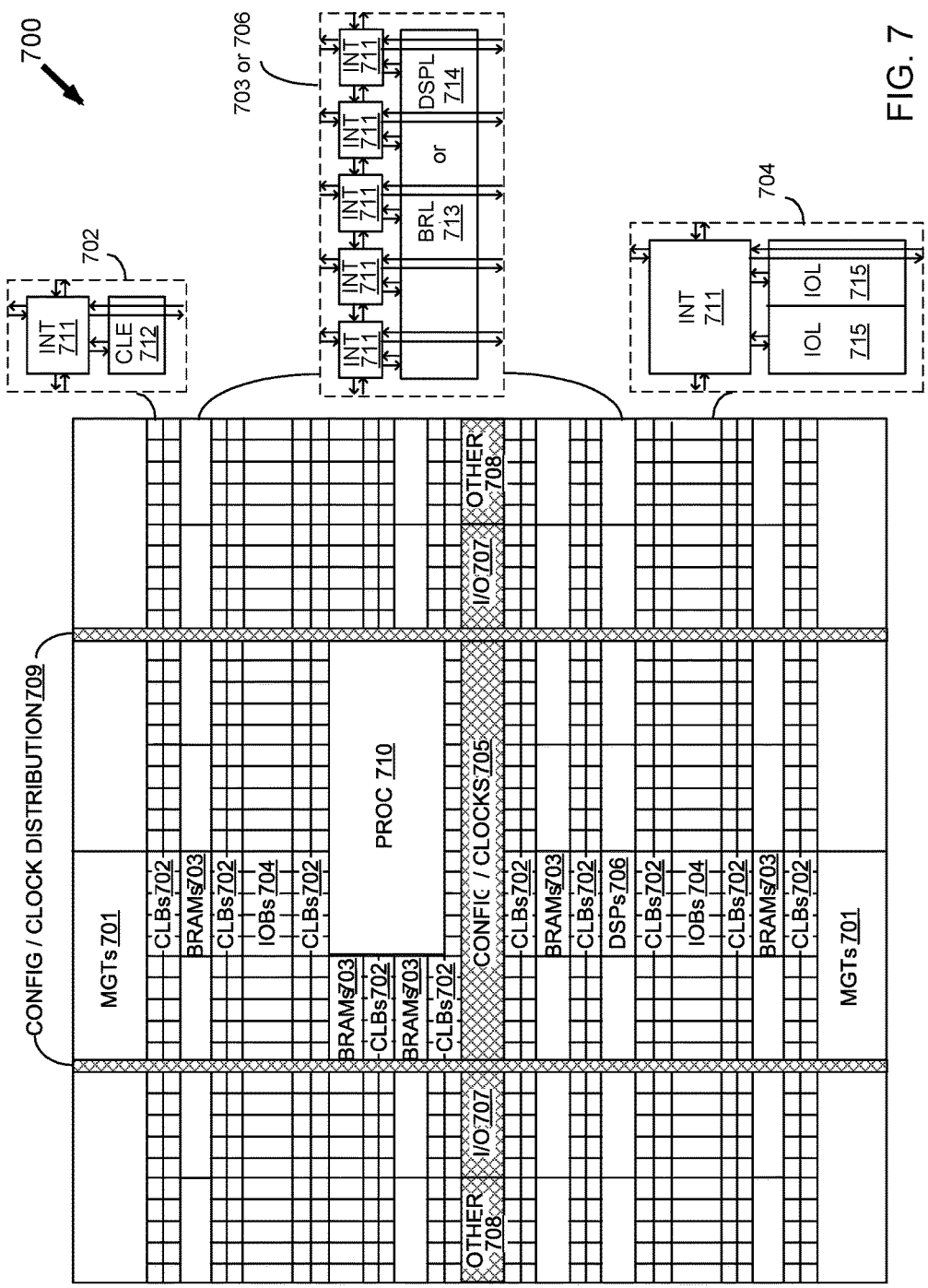
FIG. 7 is a simplified block diagram depicting an exemplary columnar Field Programmable Gate Array ("FPGA") architecture.

As noted above, advanced FPGAs can include several different types of programmable logic blocks in the array. For example, FIG. 7 illustrates an FPGA architecture 700 that includes a large number of different programmable tiles including multi-gigabit transceivers ("MGTs") 701, configurable logic blocks ("CLBs") 702, random access memory blocks ("BRAMs") 703, input/output blocks ("IOBs") 704, configuration and clocking logic ("CONFIG/CLOCKS") 705, digital signal processing blocks ("DSPs") 706, specialized input/output blocks ("I/O") 707 (e.g., configuration ports and clock ports), and other programmable logic 708 such as digital clock managers, analog-to-digital converters, system monitoring logic, and so forth. Some FPGAs also include dedicated processor blocks ("PROC") 710.

In some FPGAs, each programmable tile includes a programmable interconnect element ("INT") 711 having standardized connections to and from a corresponding interconnect element in each adjacent tile. Therefore, the programmable interconnect elements taken together implement the programmable interconnect structure for the illustrated FPGA. The programmable interconnect element 711 also includes the connections to and from the programmable logic element within the same tile, as shown by the examples included at the top of FIG. 7.

For example, a CLB 702 can include a configurable logic element ("CLE") 712 that can be programmed to implement user logic plus a single programmable interconnect element ("INT") 711. A BRAM 703 can include a BRAM logic element ("BRL") 713 in addition to one or more programmable interconnect elements. Typically, the number of interconnect elements included in a tile depends on the height of the tile. In the pictured embodiment, a BRAM tile has the same height as five CLBs, but other numbers (e.g., four) can also be used. A DSP tile 706 can include a DSP logic element ("DSPL") 714 in addition to an appropriate number of programmable interconnect elements. An IOB 704 can include, for example, two instances of an input/output logic element ("IOL") 715 in addition to one instance of the programmable interconnect element 711. As will be clear to those of skill in the art, the actual I/O pads connected, for example, to the I/O logic element 715 typically are not confined to the area of the input/output logic element 715.

In the pictured embodiment, a horizontal area near the center of the die (shown in FIG. 7) is used for configuration, clock, and other control logic. Vertical columns 709 extending from this horizontal area or column are used to distribute the clocks and configuration signals across the breadth of the FPGA.

Some FPGAs utilizing the architecture illustrated in FIG. 7 include additional logic blocks that disrupt the regular columnar structure making up a large part of the FPGA. The additional logic blocks can be programmable blocks and/or dedicated logic. For example, processor block 710 spans several columns of CLBs and BRAMs.

Note that FIG. 7 is intended to illustrate only an exemplary FPGA architecture. For example, the numbers of logic blocks in a row, the relative width of the rows, the number and order of rows, the types of logic blocks included in the rows, the relative sizes of the logic blocks, and the interconnect/logic implementations included at the top of FIG. 7 are purely exemplary. For example, in an actual FPGA more than one adjacent row of CLBs is typically included wherever the CLBs appear, to facilitate the efficient implementation of user logic, but the number of adjacent CLB rows varies with the overall size of the FPGA.

While the foregoing describes exemplary apparatus(es) and/or method(s), other and further examples in accordance with the one or more aspects described herein may be devised without departing from the scope hereof, which is determined by the claims that follow and equivalents thereof. Claims listing steps do not imply any order of the steps. Trademarks are the property of their respective owners.

What is claimed is:

1. A clock data recovery circuit, comprising:
 a bang-bang phase detector configured to receive data samples and crossing samples to generate a bang-bang detect result indicating a first phase difference between the data samples and the crossing samples;
 a baud-rate phase detector configured to receive the data samples and peak samples to generate a baud-rate detect result indicating a second phase difference between the data samples and the peak samples;
 a multiplexer configured to select either the bang-bang detect result or the baud-rate detect result as a selected phase-detect output responsive to a mode of operation;
 a control circuit configured to clear a metastable state by:
  in response to receiving the bang-bang detect result, check for dithering, determine a direction for phase adjustment responsive to detection of the dithering, and provide a phase adjustment in the direction; and
  in response to receiving the baud-rate detect result, operate to use the second phase difference generated.

2. The clock data recovery circuit according to claim 1, further comprising:
 a first sampling circuit configured to generate the data samples of a received signal responsive to a data clock signal having a data phase;
 a second sampling circuit configured to generate the crossing samples of the received signal responsive to a crossing clock signal having a crossing phase, the crossing clock signal being phase-shifted relative to the data clock signal;

a third sampling circuit configured to generate the peak samples of the received signal responsive to the data clock signal for the data phase;
a deserializer coupled to receive the data samples, the crossing samples, and the peak samples to respectively provide deserialized data samples, deserialized crossing samples, and deserialized peak samples;
the bang-bang phase detector configured to receive the deserialized data samples and the deserialized crossing samples to generate the bang-bang detect result; and
the baud-rate phase detector configured to receive the deserialized data samples and the deserialized peak samples to generate the baud-rate detect result.

3. The clock data recovery circuit according to claim 1, wherein the control circuit comprises:
a metastable detector configured to receive the selected phase-detect output and to operate in at least one of a two-cycle condition or a one-cycle condition to check for the dithering;
wherein, for the two-cycle condition, the metastable detector is configured to check for different signs and corresponding non-zero outputs of bang-bang detect results for successive cycles of operation of the clock data recovery circuit;
wherein, for the one-cycle condition, the metastable detector is configured to check for at least one up tick and down tick pair in a set of the data samples or the crossing samples for the bang-bang detect result;
a mode select circuit; and
a phase adjust circuit configured to provide the phase adjustment and the direction to an adjustable delay of the clock data recovery circuit for outputting a phase interpolator code.

4. The clock data recovery circuit according to claim 3, wherein for the selected mode of operation, the control circuit, responsive to assertion of an end of burst signal, is configured to deactivate the metastable detector and the phase adjust circuit and to set a select signal to select the baud-rate detect result as the selected phase-detect output.

5. The clock data recovery circuit according to claim 3, wherein the control circuit is configured to reset a select signal to select the bang-bang detect result as the selected phase-detect output after at least one clock cycle of operation of the baud-rate detect result.

6. The clock data recovery circuit according to claim 3, wherein for selection of the bang-bang detect result, the control circuit is configured to determine the direction to adjust the data phase and the crossing phase of the selected phase-detect output for the bang-bang detect result responsive to detection of the dithering, and to output the phase adjustment for the direction to adjust the phase interpolator code and output a speed adjustment to adjust frequency of the data clock signal.

7. The clock data recovery circuit according to claim 3, further comprising:
a signal detector configured to generate a signal detector output responsive to a differential input associated with an unequalized version of the received signal and coupled to provide the signal detector output to the control circuit; and
wherein for the selected mode of operation, the control circuit is configured to:
activate the metastable detector and the phase adjust circuit responsive to assertion of an end of burst signal;
after activation of the metastable detector and responsive to the signal detector output indicating receipt of a data burst, determine the direction to adjust the data phase and the crossing phase of the selected phase-detect output for the bang-bang detect result responsive to detection of the dithering; and
output the phase adjustment for the direction to adjust the phase interpolator code.

8. The clock data recovery circuit according to claim 3, wherein for the selected mode of operation, the control circuit is configured to activate the metastable detector and the phase adjust circuit responsive to assertion of a start of burst signal, to determine the direction to adjust the data phase and the crossing phase of the selected phase-detect output for the bang-bang detect result responsive to detection of the dithering, and to output the phase adjustment for the direction to adjust the phase interpolator code.

9. The clock data recovery circuit according to claim 3, wherein for the selected mode of operation, the control circuit is configured to activate the metastable detector and the phase adjust circuit responsive to the signal detector output indicating no signal detected followed by indicating receipt of a data burst, to determine the direction to adjust the data phase and the crossing phase of the selected phase-detect output for the bang-bang detect result responsive to detection of the dithering, and to output the phase adjustment for the direction to adjust the phase interpolator code.

10. A clock data recovery circuit, comprising:
a bang-bang phase detector configured to receive data samples and crossing samples to generate a bang-bang detect result indicating a phase difference between the data samples and the crossing samples;
a control circuit including a metastable detector, a mode select circuit, and a phase adjust circuit, the metastable detector configured to receive the bang-bang detect result;
the control circuit configured to activate the metastable detector and the phase adjust circuit responsive to receipt of an asserted one of a start of burst signal or an end of burst signal for a corresponding selected mode of operation in order to enter a metastable detection-kick mode; and
the control circuit in the metastable detection-kick mode configured to check for dithering, determine a direction for a phase adjustment responsive to detection of the dithering, and provide a phase adjustment in the direction.

11. The clock data recovery circuit according to claim 10, further comprising:
the metastable detector in the metastable detection-kick mode is configured to operate in at least one of a two-cycle condition or a one-cycle condition to check for the dithering;
for the two-cycle condition, the metastable detector is configured to check for different signs and corresponding non-zero outputs for bang-bang detect results of the bang-bang phase detector respectively for successive cycles of the clock data recovery circuit;
for the one-cycle condition, the metastable detector is configured to check for at least one up tick and down tick pair in a set of the data samples or the crossing samples for the bang-bang detect result of the bang-bang phase detector in one cycle of the clock data recovery circuit;
the phase adjust circuit in the metastable detection-kick mode is configured to provide the phase adjustment in the direction to an adjustable delay of the clock data recovery circuit; and the adjustable delay is configured to output a phase interpolator code adjusted responsive to the phase adjustment in the direction for the dithering.

12. The clock data recovery circuit according to claim 11, further comprising:
a signal detector configured to generate a signal detector output responsive to a differential input associated with an unequalized version of the received signal and coupled to provide the signal detector output to the control circuit; and
wherein for the selected mode of operation, the control circuit is configured to:
activate the metastable detector and the phase adjust circuit responsive to assertion of the end of burst signal;
after activation of the metastable detector and responsive to the signal detector output indicating receipt of a data burst, determine the direction to adjust the data phase and the crossing phase of the bang-bang detect result responsive to detection of the dithering; and
output the phase adjustment for the direction to adjust the phase interpolator code.

13. The clock data recovery circuit according to claim 11, wherein for the selected mode of operation, the control circuit is configured to activate the metastable detector and the phase adjust circuit responsive to assertion of the start of burst signal, to determine the direction to adjust the data phase and the crossing phase of the selected phase-detect output for the bang-bang detect result responsive to detection of the dithering, and to output the phase adjustment for the direction to adjust the phase interpolator code.

14. A method for a clock data recovery circuit, comprising:
obtaining a received signal by the clock data recovery circuit for generating a sampling clock signal, the generating comprising:
sampling of a received signal to generate data samples and peak samples responsive to a data clock signal having a data phase;
sampling of the received signal to generate crossing samples responsive to a crossing clock signal having a crossing phase;
generating a bang-bang detect result from the data samples and the crossing samples by a bang-bang phase detector indicating a first phase difference between the data samples and the crossing samples;
generating a baud-rate detect result from the data samples and the peak samples by a baud-rate phase detector indicating a second phase difference between the data samples and the peak samples;
generating by a control circuit a select signal for a selected mode of operation from a plurality of operational modes;
selecting either the bang-bang detect result or the baud-rate detect result as a selected phase-detect output from a multiplexer responsive to the select signal; and
operating the control circuit in the selected mode of operation to clear a metastable state.

15. The method according to claim 14, further comprising:
deserializing by a deserializer the data samples, the crossing samples, and the peak samples to respectively provide deserialized data samples, deserialized crossing samples, and deserialized peak samples; and
the operating of the control circuit for receipt of the bang-bang detect result by the control circuit comprises:
checking for dithering;
determining a direction for phase adjustment responsive to detection of the dithering; and
providing a phase adjustment in the direction; and
the operating of the control circuit for receipt of the baud-rate detect result by the control circuit comprises:
counting to a cycle number before a reset of the select signal; and
resetting the select signal to select the bang-bang detect result for the selected phase-detect output from the multiplexer.

16. The method according to claim 15, wherein the operating of the control circuit for receipt of the bang-bang detect result by the control circuit comprises:
operating a metastable detector of the control circuit in at least one of a two-cycle condition or a one-cycle condition to check for the dithering;
operating a phase adjust circuit of the control circuit to provide the phase adjustment in the direction; and
adjusting by an adjustable delay of the clock data recovery circuit a phase interpolator code responsive to the phase adjustment in the direction for the dithering.

17. The method according to claim 16, further comprising activating the metastable detector and the phase adjust circuit responsive to receipt of a start of burst signal.

18. The method according to claim 16, further comprising:
activating the metastable detector and the phase adjust circuit responsive to receipt of an end of burst signal;
generating by a signal detector a signal detector output responsive to a differential input associated with an unequalized version of the received signal to provide the signal detector output to the control circuit; and
entering a metastable detection-kick mode by the metastable detector and the phase adjust circuit responsive to the signal detector output indicating receipt of a data burst.

19. The method according to claim 16, further comprising:
activating the metastable detector and the phase adjust circuit responsive to a signal detector output of a signal detector indicating no signal detected; and
responsive to the signal detector output indicating receipt of a data burst, entering a metastable detection-kick mode by the metastable detector and the phase adjust circuit.

20. The method according to claim 15, wherein the operating of the control circuit for receipt of the baud-rate detect result by the control circuit comprises:
deactivating the metastable detector and the phase adjust circuit of the control circuit responsive to receipt of an end of burst signal; and
performing the resetting of the select signal to select the bang-bang detect result as the selected phase-detect output after at least one clock cycle for the baud-rate detect result is counted for the cycle number.

* * * * *